United States Patent
Narimatsu et al.

(10) Patent No.: US 6,323,560 B1
(45) Date of Patent: Nov. 27, 2001

(54) REGISTRATION ACCURACY MEASUREMENT MARK, METHOD OF REPAIRING DEFECT OF THE MARK, PHOTOMASK HAVING THE MARK, METHOD OF MANUFACTURING THE PHOTO MASK AND METHOD OF EXPOSURE THEREOF

(75) Inventors: Koichiro Narimatsu; Shigenori Yamashita; Nobuyuki Yoshioka; Shinya Soeda; Atsushi Hachisuka; Koji Taniguchi; Yuki Miyamoto; Takayuki Saito; Ayumi Minamide, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,750

(22) Filed: Jan. 27, 2000

Related U.S. Application Data

(62) Division of application No. 09/231,664, filed on Jan. 15, 1999, which is a division of application No. 08/670,313, filed on Jun. 27, 1996, now Pat. No. 5,892,291.

(30) Foreign Application Priority Data

Jun. 27, 1995 (JP) .................................................. 7-160741
May 9, 1996 (JP) .................................................. 8-114746

(51) Int. Cl.⁷ .................................................. H01L 23/58
(52) U.S. Cl. ........................................... 257/798; 257/797
(58) Field of Search .................................... 257/797, 798; 438/401, 462, 975, 4, 14

(56) References Cited

U.S. PATENT DOCUMENTS

| | | |
|---|---|---|
| 4,655,598 | 4/1987 | Murakami et al. . |
| 5,250,983 | 10/1993 | Yamamura . |
| 5,308,682 | 5/1994 | Morikawa . |
| 5,457,334 | 10/1995 | Nishimoto . |
| 5,487,963 | 1/1996 | Sugawara . |
| 5,614,767 | 3/1997 | Ohara . |
| 5,646,452 | 7/1997 | Narimatsu . |
| 5,888,674 | 3/1999 | Yang et al. . |

FOREIGN PATENT DOCUMENTS

| | | |
|---|---|---|
| 44 14 369 | 10/1994 | (DE) . |
| 0 459 737 | 12/1991 | (EP) . |
| 63-260045 | 10/1988 | (JP) . |

*Primary Examiner*—Sara Crane
*Assistant Examiner*—Thien F. Tran
(74) *Attorney, Agent, or Firm*—McDermott, Will & Emery

(57) ABSTRACT

The present invention includes a first semiconductor element forming member formed in a first layer, a first measurement mark formed by the same manufacturing step as the first semiconductor element forming member, a second semiconductor element forming member formed in a second layer above the first layer, and a second measurement mark formed in the same manufacturing step as the second semiconductor element forming member for measuring registration accuracy between the first and second semiconductor element forming members. The first measurement mark has a pattern which receives same influence of aberration as the first semiconductor element forming member when irradiated with light, and the second measurement mark has a pattern which receives same influence of aberration as the second semiconductor element forming member when irradiated with light. Thus, a registration accuracy measurement mark taking into consideration the influence of aberration can be provided.

3 Claims, 41 Drawing Sheets

FIG.22
(a) PLAN VIEW OF THE PATTERN OF THE PHASE SHIFT MASK
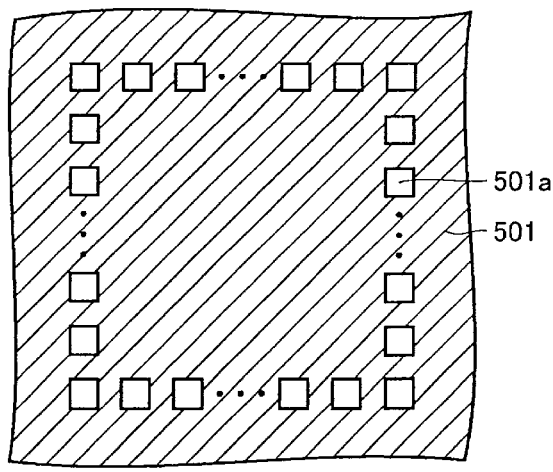
(b) CROSS SECTION OF THE PATTERN AFTER WAFER TRANSFER
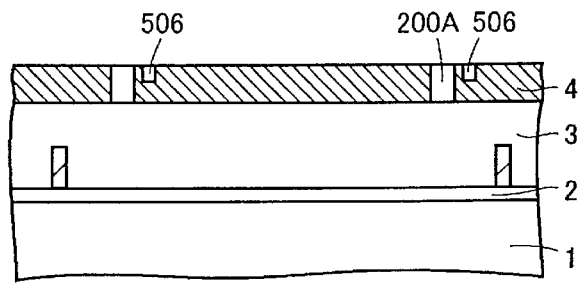
(c) PLAN VIEW OF THE PATTERN AFTER WAFER TRANSFER
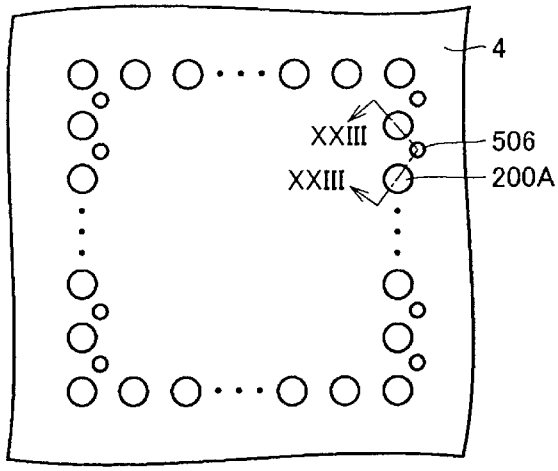
(d) DETECTION SIGNAL
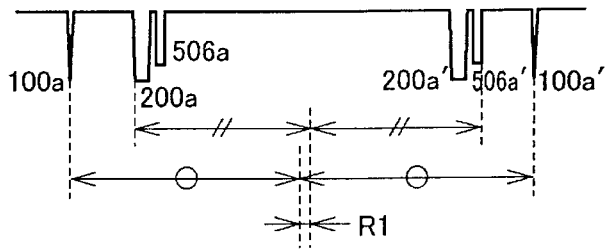

FIG.25
(a) PLAN VIEW OF THE PATTERN OF THE PHASE SHIFT MASK
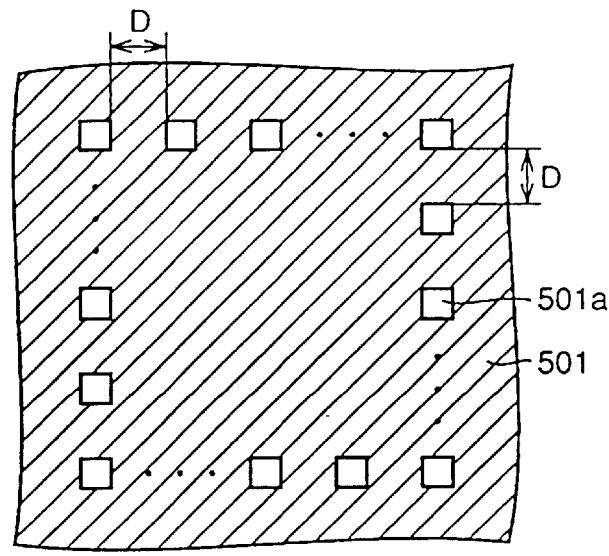
(b) PLAN VIEW OF THE PATTERN AFTER WAFER TRANSFER
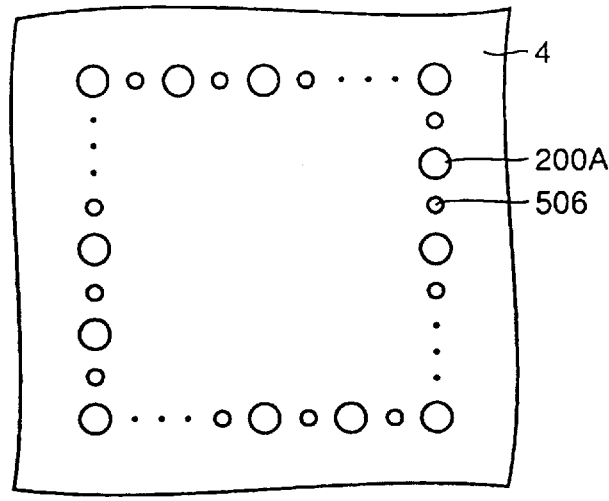
(c) DETECTION SIGNAL
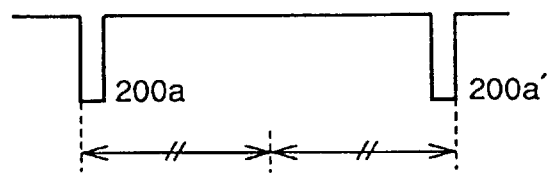

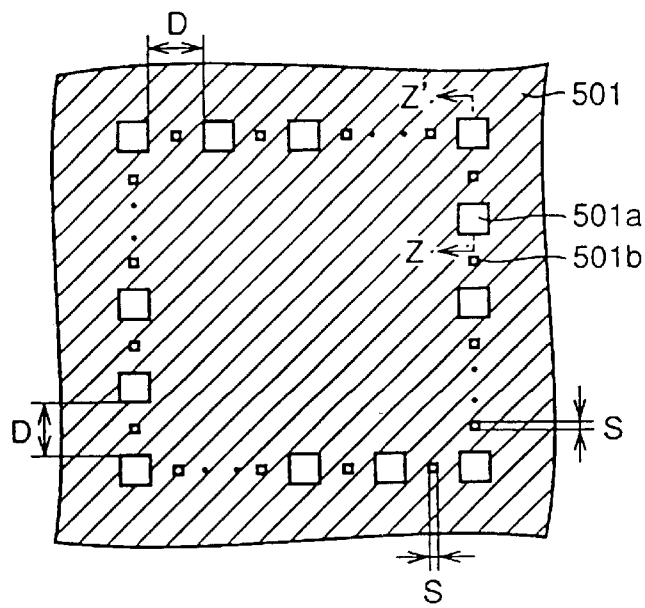
(a) PLAN VIEW OF THE PATTERN OF THE PHASE SHIFT MASK
FIG.26
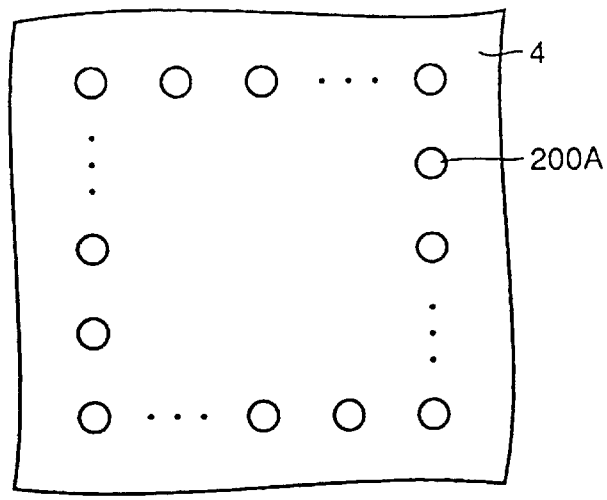
(b) PLAN VIEW OF THE PATTERN AFTER WAFER TRANSFER
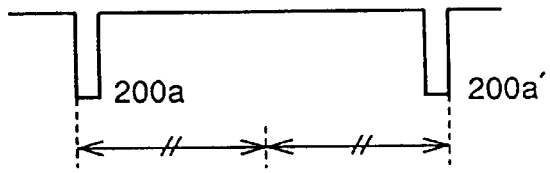
(c) DETECTION SIGNAL

PLAN VIEW OF
THE PATTERN
OF THE PHASE
SHIFT MASK

PLAN VIEW OF
THE PATTERN
OF THE PHASE
SHIFT MASK

FIG.30
(a) PLAN VIEW OF THE PATTERN OF THE PHASE SHIFT MASK
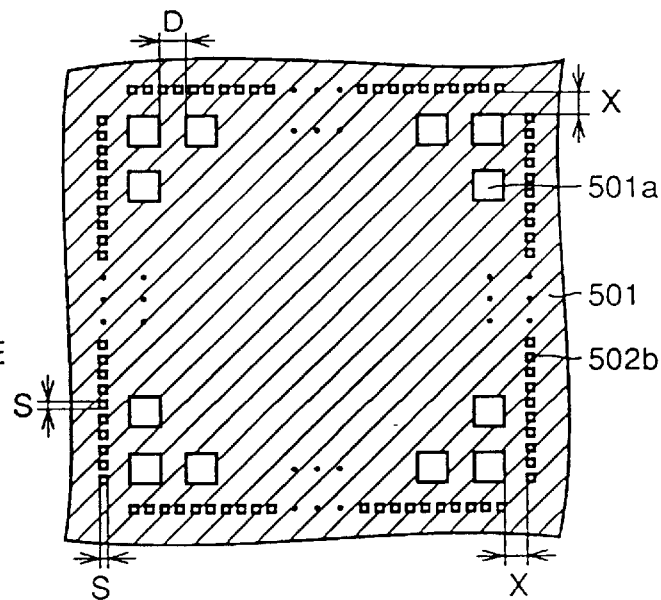
(b) PLAN VIEW OF THE PATTERN AFTER WAFER TRANSFER
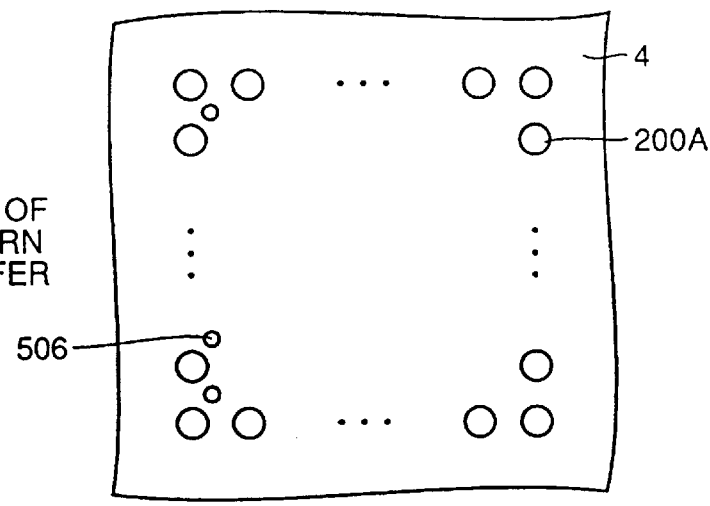
(c) DETECTION SIGNAL
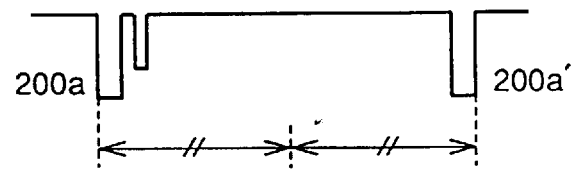

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

FIG.49
(a) PLAN VIEW OF THE PATTERN OF THE PHASE SHIFT MASK
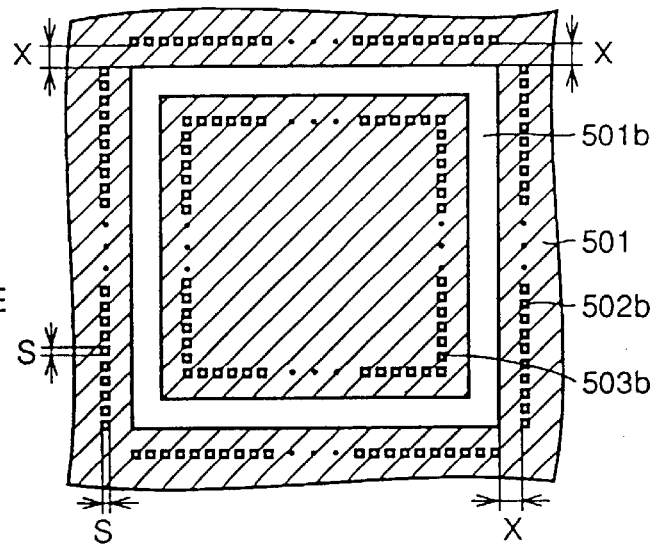
(b) PLAN VIEW OF THE PATTERN AFTER WAFER TRANSFER
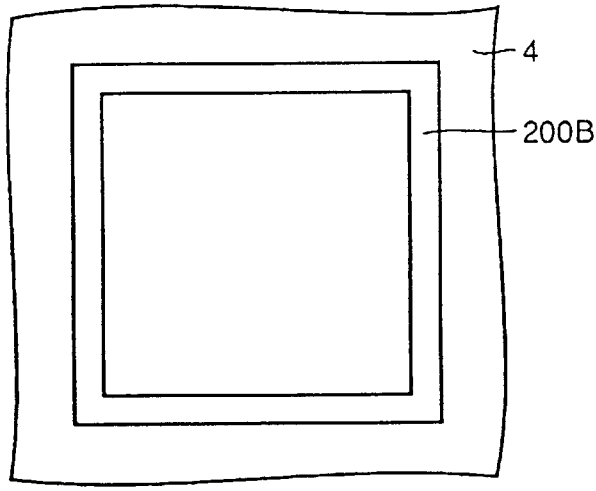
(c) DETECTION SIGNAL
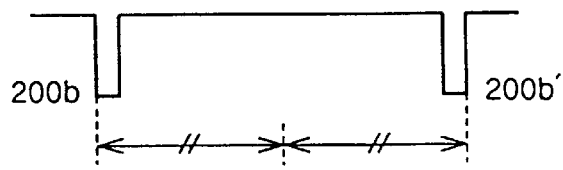

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

PLAN VIEW OF
THE PATTERN
OF THE PHASE
SHIFT MASK

FIG.62 PRIOR ART
AMOUNT OF PATTERN DEVIATION CAUSED BY COMATIC
ABBERATION RESULT OF PARTIAL SIMULATION
NA/σ =0.57/0.4  NORMAL MASK
LIGHT INTENSITY=60%
POSITION WHERE ABBERATION=0
 (AMOUNT OF DEVIATION=0) IS USED AS REFERENCE
FOR EACH PATTERN

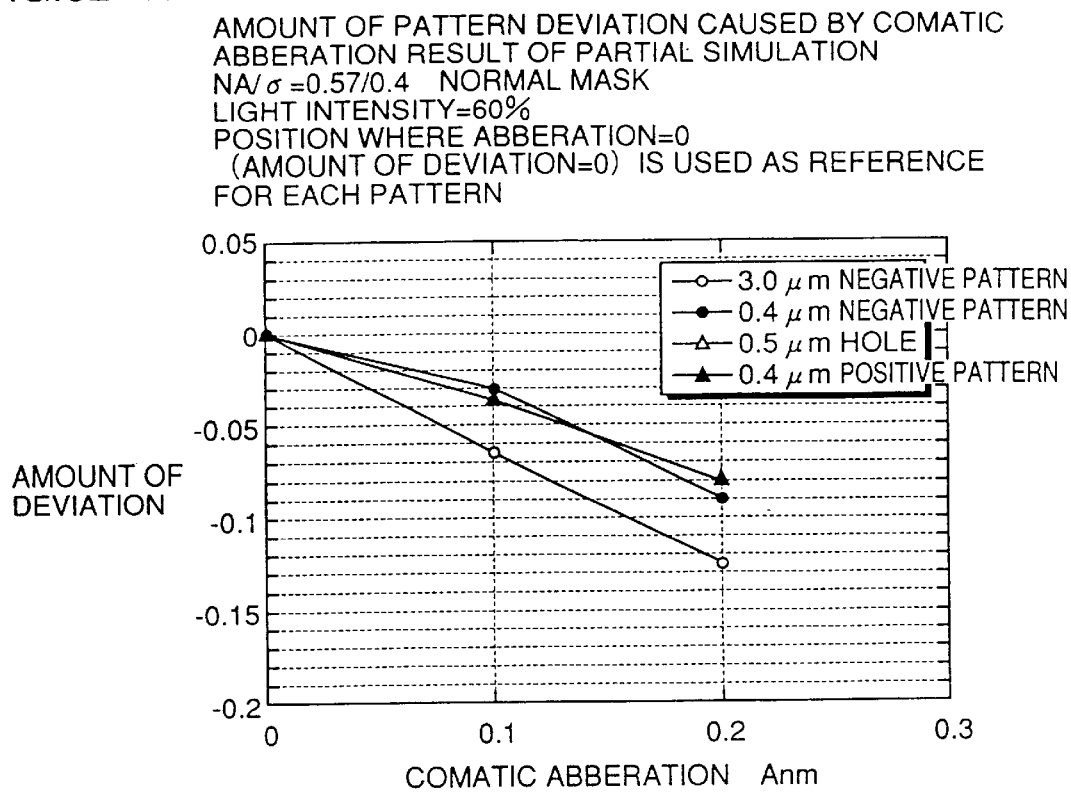

FIG.63 PRIOR ART
AMOUNT OF PATTERN DEVIATION CAUSED BY COMATIC
ABBERATION RESULT OF PARTIAL SIMULATION
NA/σ =0.57/0.4  HT MASK
LIGHT INTENSITY=60%
POSITION WHERE ABBERATION=0
 (AMOUNT OF DEVIATION=0) IS USED AS REFERENCE
FOR EACH PATTERN

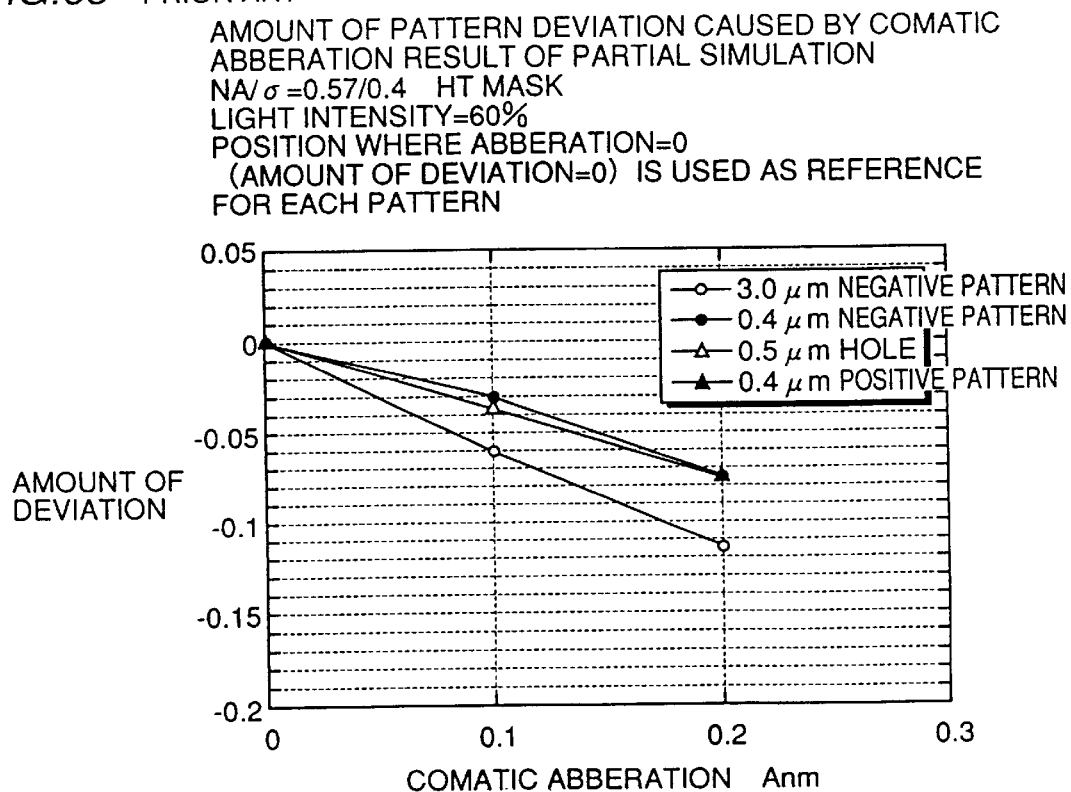

REGISTRATION ACCURACY MEASUREMENT MARK, METHOD OF REPAIRING DEFECT OF THE MARK, PHOTOMASK HAVING THE MARK, METHOD OF MANUFACTURING THE PHOTO MASK AND METHOD OF EXPOSURE THEREOF

This application is a Divisional of application Ser. No. 09/231,664 filed Jan. 15, 1999, which is a Divisional of application Ser. No. 08/670,313 filed Jun. 27, 1996 U.S. Pat. No. 5,892,291.

BACKGROUND OF THE INVENTION

1. Field of the Invention

The present invention relates to exposure technique and, more specifically, to an improvement of exposure technique taking into consideration the influence of aberration.

2. Description of the Background Art

Recently, elements constituting a semiconductor device, which is formed of a plurality of layers, come to be smaller and smaller. Therefore, registration accuracy of the elements formed in various layers of the semiconductor device comes to be more important. In addition, as the element has been miniaturized, influence to exposure caused by aberration of the optical system becomes significant.

The aforementioned registration accuracy is related to the following factors of errors.

(i) registration error: registration error in general meaning;

(ii) alignment error: errors in X, Y and θ directions in aligned chip;

(iii) machine stability and compatibility error: error inherent to the aligner itself;

(iv) mask error: error in pattern location from ideal point of each coordinate point of the mask;

(v) mask thermal expansion error: registration error derived from thermal expansion of the mask in the aligner;

(vi) residual error: error caused by bending when the mask or the wafer is fixed, non linear distortion at high temperature heat treatment of the wafer and so on.

Of the various factors of registration error mentioned above, here, (i) registration error will be described.

First, referring to the figures, registration error measurement mark for measuring the registration error will be described, taking an MOS transistor as an example.

FIG. 54 is a vertical section of a general MOS transistor, and FIG. 55 is a plane view of a semiconductor device including the MOS transistor.

Referring to these figures, the structure of the MOS transistor will be briefly described. First, on a semiconductor substrate 76, a word line 80A constituting a gate electrode is formed, with a gate oxide film 78 interposed. Source/drain regions 77 are formed in semiconductor substrate 76.

Above gate electrode 80A, a bit line 82A is formed, with an interlayer oxide film 80 interposed. Bit line 82A is electrically connected to one of source/drain region 77. Word line 80A and bit line 82A are arranged orthogonally crossing each other as shown in FIG. 55. An interlayer oxide film 83 is formed on bit line 82A.

Referring to FIG. 55, assume that in the semiconductor device having the above-described structure, a contact hole 74 is formed in an active region 85 between word lines 80A and bit lines 82A which word lines and bit lines are arranged apart by 1 $\mu$m from each other. The line width of word line 80A and the line width of bit line 82A are both 0.4 $\mu$m.

The size of the contact hole 74 opened in the semiconductor device is 0.5 $\mu$m×0.5 $\mu$m. Therefore, when word lines 80A and bit lines 82A and contact hole 74 are formed registered exactly as designed, the distance X in the X direction between word line 80A and contact hole 74 and the distance Y in Y direction between bit line 82A and contact hole 74 would be both 0.25 $\mu$m.

However, contact hole 74 may be opened out of position because of registration error. In that case, it is possible that part of the contact hole 74 is opened in word line 80A or bit line 82A.

Here, contact hole 74 is opened by the following manner. First, as shown in FIG. 54, a resist film 84A formed on interlayer oxide film 83 is patterned by photolithography, and using the patterned resist film 84A, the contact hole is opened.

Therefore, after the resist film 84A is patterned, deviation between the position of the pattern for the contact hole formed in resist film 84A and the positions of word lines 80A and bit lines 82A is measured, and if the contact hole pattern of the resist film is not accurate, only the resist film 84A have to be formed again.

However, the space between the contact hole 74 and word line 80A or between contact hole 74 and bit line 82A is as small as 0.25 $\mu$m, and therefore it is difficult to measure registration error in this region.

Therefore, a method has been proposed in which a registration error measurement mark as a dummy pattern for measuring registration error is formed in a peripheral region around a semiconductor forming region simultaneously with the formation of the resist film, the word line and the bit line, and by measuring registration error of the measurement mark, registration error between the contact hole pattern of the resist film and the word lines and bit lines is measured.

The registration error measurement mark will be described with reference to FIGS. 56 and 57. First, referring to FIG. 56, arrangement of the registration error measurement mark will be described. In a peripheral region of the semiconductor device, a first measurement mask 80B is formed at a prescribed position simultaneously with word line 80A on gate oxide film 78.

Planar shape of the first measurement mark 80B is a square of 25 $\mu$m×25 $\mu$m as shown in FIG. 24A. Further, a second measurement mark 82B is formed at a prescribed position of interlayer oxide film 80, simultaneously with bit line 82A. The planar shape of second measurement mark 82B is also a square of 25 $\mu$m×25 $\mu$m, similar to the first measurement mark 80B of FIG. 57.

Above the first measurement mark 80B and the second measurement mark 82B on interlayer insulating film 83, third and fourth measurement marks 84B and 84C are formed simultaneously with the patterning of the resist film.

The size of the third and fourth measurement marks 84B and 84C is 15 $\mu$m×15 $\mu$m as shown in FIG. 57(a).

The first to fourth measurement marks 80B, 82B, 84B and 84C are adapted to have square planar shape, in order to meet the requirement of a measurement inspecting apparatus (for example, KLA5011 manufactured by KLA), allowing recognition of the positions of the sides of the square. The length of one side of the mark is required to be 15 to 30 $\mu$m for the first and second measurement marks and 7.5 to 15 $\mu$m for the third and fourth measurement marks. By the present technique, it is impossible to inspect registration of smaller dimensions.

Referring to FIG. 57, measurement of registration error between the word line 80A and the contact hole pattern of the resist film using the first and the third measurement marks 80B and 84B will be described.

FIG. 57(*a*) is a plane view from above of the third measurement mark 84B. FIG. 57(*b*) is a cross section taken along the line LVII(*a*)—LVII(*a*) of FIG. 57(*a*). FIG. 57(*c*) shows brightness of detection signal corresponding to the cross section taken along the line LVII(*a*)—LVII(*a*) of FIG. 57(*a*).

As can be seen from the figure, at the positions of side walls 10*a*, 10*b*, 11*a* and 11*b* of the first and third measurement marks 80B and 84B, the detection signal becomes dark. Here, by using the detection signal, registration error between word line 80A and the contact hole pattern of the resist film is measured.

For example, the center between the detection signals corresponding to the side walls 10*a* and 10*b* is found and the center $c_2$ of the detection signals corresponding to side walls 11*a* and 11*b* is found. When the positions of the centers $c_1$ and $c_2$ coincide with each other, the deviation between the first and third measurement marks 80B and 84B is zero. When the positions of centers $c_1$ and $c_2$ do not coincide with each other, the difference therebetween corresponds to the amount of deviation between the first and third measurement marks 80B and 84B. This amount of deviation is in one to one correspondence with the amount of deviation between word line 80A and the contact hole pattern of the resist film, and hence it can be directly regarded as registration error.

The amount of deviation between the second and fourth measurement marks 82B and 84C can also be found by the similar manner.

In the example of FIG. 57, both the first and third measurement marks 80B and 84B are positive pattern. However, even in the example of FIG. 58(*a*) in which both the first and third measurement marks 180B and 184B are negative patterns, the amount of deviation between the first and third measurement marks 180B and 184B can be found in the similar manner as the example of FIG. 57, by finding the center between detection signals corresponding to side walls 110*a* and 110*b* and the center between the detection signals corresponding to side walls 111*a* and 111*b*. In this case also, the amount of deviation can be regarded divided as the registration error.

However, the measurement of registration error described above undergoes the influence of aberration, so that the amount of deviation between the contact hole pattern and the word line or the bit line is not exactly in one to one correspondence to the amount of deviation between the measurement marks.

The aberration will be briefly described. An optical system should ideally satisfy the following conditions of image formation. Namely, (i) bundle of rays emitted in point symmetry from an object point must form an image of point symmetry at the image point, (ii) an image of a two dimensional object should be two dimensional, and (iii) lateral magnification should be constant anywhere in the image.

These requirements are for monochromic light. However, these should desirably be satisfied when polychromatic light (white light) is used. Deviation from the ideal conditions of image formation is referred to as aberration.

The aberration caused when the condition (i) is not satisfied is referred to as spherical aberration, a stigmatism or comatic aberration.

The aberration caused if the condition (ii) is not satisfied is referred to as aberration caused by the curvature of field.

The aberration caused if the condition (iii) is not satisfied is referred to as distortion aberration.

Here, the comatic aberration, which has the most significant influence in measuring the registration error will be described with reference to FIGS. 59 to 64.

First, referring to FIG. 59, comatic aberration caused at an opening in a photomask will be described. It is assumed that the photomask includes not only a general photomask but also a phase shift mask and an attenuation type phase shift mask.

FIG. 59(*a*) shows a cross sectional structure of a photo mask 110. On a transparent substrate 211, a light transmitting portion 212B and a light intercepting portion 212A (having the hole diameter of 0.4 $\mu$m) are formed. Intensity of light 220 which has past through light transmitting portion 212B on resist film 4 should be as shown by the solid line 221 of FIG. 59(*b*). However, because of the influence of comatic aberration, the light intensity significantly deviates from the ideal curves in one direction only. Therefore the right hand portion exhibits such intensity as represented by the dotted line 222.

As a result, in resist film 4, a hole having not the intended size $L_1$ but the size $L_2$ ($L_2 > L_1$) is opened as shown in FIG. 59(*c*).

Referring to FIG. 60, an example will be described in which light transmitting portion 232B formed on photomask 230 is larger than the photomask 210 of FIG. 59. FIG. 60(*a*) shows a cross sectional structure of photomask 230. On a transparent substrate 231, a light transmitting portion 232B and a light intercepting portion 232A (having the hole diameter of 3.0 $\mu$m) are formed. Intensity of light 220 which has past through light transmitting portion 232B on resist film 4 should be as shown by the solid line 221 of FIG. 60(*b*).

However, as already described with reference to FIG. 26, light intensity significantly deviates from the ideal carve only in one direction because of the influence of comatic aberration. Therefore, the light intensity on the right hand portion is as shown by the dotted line 222.

As a result, in resist film 4, a hole not having the intended size $L_3$ but having the size $L_4$ is opened as shown in FIG. 60(*c*). It is also known that the larger the opening area of the light transmitting portion of the photomask, the larger the influence of comatic aberration.

Influence of comatic aberration on negative patterns have been described with reference to FIGS. 59 and 60. The influence of comatic aberration on positive patterns will be described with reference to FIG. 61.

FIG. 61(*a*) shows a cross sectional structure of a photomask 240. On a transparent substrate 241 of photomask 240, a prescribed positive pattern 242A is formed. The intensity of light 220 which has past through the photomask 240 should be as shown by the solid line 221 of FIG. 61(*b*) on resist film 4. However, because of the influence of comatic aberration, the light intensity is deviated only in one direction, and therefore on the left side portion, the light intensity becomes as shown by the dotted line 222.

As a result, in resist film 4, a pattern not having the intended size $L_5$ but the size $L_6$ is left as shown in FIG. 61(*c*). Therefore, as shown in FIGS. 59 to 61, both photo masks having positive patterns and negative patterns undergo the influence of comatic aberration.

The relation between the size of the pattern of the photo mask and the amount of deviation in light intensity caused by comatic aberration for a common photomask and for a phase shift mask are plotted in FIGS. 62 and 63.

As can be seen from these graphs, no matter whether it is a common photomask or a phase shift mask, the larger the pattern opening, the larger the influence of comatic aberration, and the larger the amount of deviation.

Accordingly, even when registration error is measured by using marks, the measured registration error is not in one to one correspondence with the error of the patterns constituting the semiconductor device, since the influence of comatic aberration on the marks differ from the influence on the patterns constituting the semiconductor device.

The comatic aberration influences not only the measurement of registration error but also the pattern exposure when the semiconductor device is formed. Let us consider an example, such as shown in FIG. 64(a), in which light transmitting portions 252A and 252B having different opening areas are formed on a transparent substrate 251 of one photomask 250.

Intensity of light which has past through light transmitting portion 252A on resist film 4 should be as shown by the solid line 221A and intensity of light which has past through light transmitting portion 252B should be as shown by the solid line 221B of FIG. 64(b). However, because of the influence of comatic aberration, on the right hand side, the intensity of light which has past through portion 252A is deviated as represented by the dotted line 222A, and the intensity of light which has past through the portion 252B is deviated to the right of the solid line 221B, as shown in the dotted line 222B.

The amount of deviation $L_9$ of the dotted line 222A and the amount of deviation $L_{12}$ of dotted line 222B are not equal to each other, and these amounts depend on the opening area of the light transmitting portion. Therefore, there are a plurality of different amounts of deviations defined by the size of the pattern. As a result, holes not having the intended size but including amount of deviation are opened in resist film 4, as shown in FIG. 64(c).

SUMMARY OF THE INVENTION

An object of the present invention is to provide registration accuracy measurement mark taking into consideration the influence of the aberration.

Another object of the present invention is to provide a method of repairing defect of registration accuracy measurement mark taking into consideration the influence of aberration.

A still another object of the present invention is to provide a photomask taking into consideration the influence of aberration.

A still further object of the present invention is to provide a method of manufacturing a photomask taking into consideration the influence of aberration.

A still further object of the present invention is to provide a method of exposure using a photomask taking into consideration the influence of aberration.

The above described objects can be attained by the registration accuracy measurement mask in accordance with the present invention, including a semiconductor device forming region on which a plural layers of patterns constituting semiconductor elements of prescribed shapes are formed on a semiconductor substrate; a registration accuracy measurement mark forming region for measuring registration accuracy of respective layers constituting the semiconductor elements; a first semiconductor element constituting member formed in a first layer of said semiconductor device forming region; a first measurement mark formed in the same step as the first semiconductor element forming member in the registration accuracy measurement mark forming region; a second semiconductor element forming member formed in a second layer above the first layer of the semiconductor device forming region; and a second measurement mark formed in the same step as the second semiconductor element forming member in the registration accuracy measurement mark forming region, in order to measure registration accuracy between the first and second semiconductor element forming members. The first measurement mark has a pattern which is subjected to the same influence of aberration as the first semiconductor element forming member when irradiated with light, and the second measurement mark has a pattern which experiences the same influence of aberration as the second semiconductor element forming member when irradiated with light.

Accordingly, the influence of aberration on the detection signal obtained by the first and second measurement marks is the same as the influence of aberration on the detection signal obtained at the first and second semiconductor element forming members.

Therefore, the data based on the detection signals obtained at the first and second measurement marks reflects in one to one correspondence the relation between the first and second semiconductor element forming members.

As a result, in measuring registration accuracy, the result of measurement is highly reliable, and hence a semiconductor device having high performance can be obtained.

The method of repairing defects of the registration accuracy measurement mark in accordance with the present invention attaining the above described objects is, in a device which includes a semiconductor device forming region on which a plural layers of patterns constituting semiconductor elements of prescribed shapes are formed on a semiconductor substrate; a registration accuracy measurement mark forming region for measuring registration accuracy of respective layers constituting the semiconductor device; a first semiconductor element forming member formed in a first layer in the semiconductor device forming region; a first measurement mark formed in the same step as the first semiconductor element forming member in the registration accuracy measurement mark forming region and having a pattern which experiences the same influence of aberration as the first semiconductor element forming member when irradiated with light; a second semiconductor element forming member formed on a second layer above the first layer in the first semiconductor device forming region; and a second measurement mark formed in the same step as the second semiconductor element forming member for measuring registration accuracy between the first and second semiconductor element forming members in the registration accuracy measurement mark forming region, and having a pattern which experiences the same influence of aberration as the second semiconductor element forming member when irradiated with light; in which the first measurement mark has a pattern including a plurality of first auxiliary measurement marks combined along at least four sides of a virtual rectangle, the auxiliary measurement mark having approximately the same size as the pattern size of the fist semiconductor element forming member; the second measurement mark has a pattern including a plurality of second auxiliary measurement marks combined along at least four sides of virtual rectangle, the second auxiliary measurement marks having approximately the same size as the pattern size of the second semiconductor element forming member; the method of repairing the defect when part of the first auxiliary measurement mark of the first measurement mark and part of the second auxiliary measurement mark of the second measurement mark are defective, including the steps of correcting the defective first auxiliary measurement mark and the defective second auxiliary measurement mark, and at the same time, correcting the first and second auxiliary correcting marks at points of symmetry with respect to an intersection of diagonals of the virtual rectangle.

Accordingly, symmetry of the first and second measurement marks is ensured, and hence the first and second measurement marks can be surely recognized by the registration inspecting apparatus.

As a result, unsatisfactory measurement of registration accuracy caused by erroneous recognition of the first and second measurement marks can be avoided.

The photomask of the present invention attaining the above-described objects includes a first region having a first pattern and a second region having a second pattern on a transparent substrate, and the second pattern is prepared by combining a plurality of the first patterns so that it experiences the same influence of aberration when the first pattern is irradiated with light.

The method of manufacturing the photomask in accordance with the present invention attaining the above-described objects includes the following steps.

First, on a transparent substrate, a light control film for adjusting transmissivity and phase angle of exposure light is formed. Thereafter, a resist film is formed on the light control film.

Thereafter, on the resist film, the first region having the first pattern and the second region having the second pattern prepared by combining a plurality of the first patterns so as to experience the same influence of aberration as the first pattern, are formed. Then, the light control film is patterned in accordance with the first pattern in the first region and the second pattern in the second region of the resist film.

In accordance with the photomask and the method of manufacturing described above, the influence of aberration on the first and second patterns is the same. Therefore, when a pattern is to be provided on a photomask taking the aberration into consideration, it is possible to correct the first and second patterns similarly. As a result, it becomes possible to provide a photomask of fine performance.

The method of measurement of the present invention attaining the above described objects includes the following steps.

By using a photomask prepared by forming a first region having a first pattern and a second region having a second pattern prepared by combining a plurality of the first patterns so as to receive the same influence of aberration as the first pattern, on a transparent substrate, a first layer on the semiconductor substrate is patterned.

Thereafter, by using a second photomask including a third region having a third pattern and a fourth region having a fourth pattern prepared by combining a plurality of the third patterns so as to receive the same influence of aberration as the third pattern on a transparent substrate, a second layer on the first layer is patterned.

Therefore, the registration accuracy between the first and third patterns and registration accuracy between the second and fourth patterns come to be in one to one correspondence.

As a result, even when registration accuracy of the first and third patterns can not be measured, it can be indirectly measured based on the measurement of registration accuracy between the second and fourth patterns.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 shows the fourth embodiment in which (a) is a plan view of the pattern of the phase shift mask, (b) is a cross section of the pattern after wafer transfer, (c) is a plan view of the pattern after wafer transfer, and (d) shows a detection signal.

FIG. 25 shows a second example of the fourth embodiment in which (a) is a plan view of the mask pattern of the phase shift mask, (b) is a plan view of the pattern after wafer transfer, and (c) shows a detection signal.

FIG. 26 shows a third example of the fourth embodiment in which (a) is a plan view of the mask pattern of the phase shift mask, (b) is a plan view of the pattern after wafer transfer, and (c) shows a detection signal.

FIG. 30 shows a fourth example of the fourth embodiment in which (a) is a plan view of a mask pattern of the phase shift mask, (b) is a plan view of the pattern after wafer transfer, and (c) shows a detection signal.

FIG. 49 shows an eighth example of the fourth embodiment in which (a) is a plan view of the mask pattern of the phase shift mask, (b) is a plan view of the pattern after wafer transfer, and (c) shows a detection signal.

FIG. 62 shows a relation between an amount of deviation and comatic aberration of a normal mask.

FIG. 63 shows a relation between the amount of deviation and comatic aberration of a phase shift mask.

DESCRIPTION OF THE PREFERRED EMBODIMENTS (Embodiment 1)

A first embodiment of the present invention will be described with reference to FIG. 1. In this embodiment, the registration error measurement mark will be described.

Figure 55:
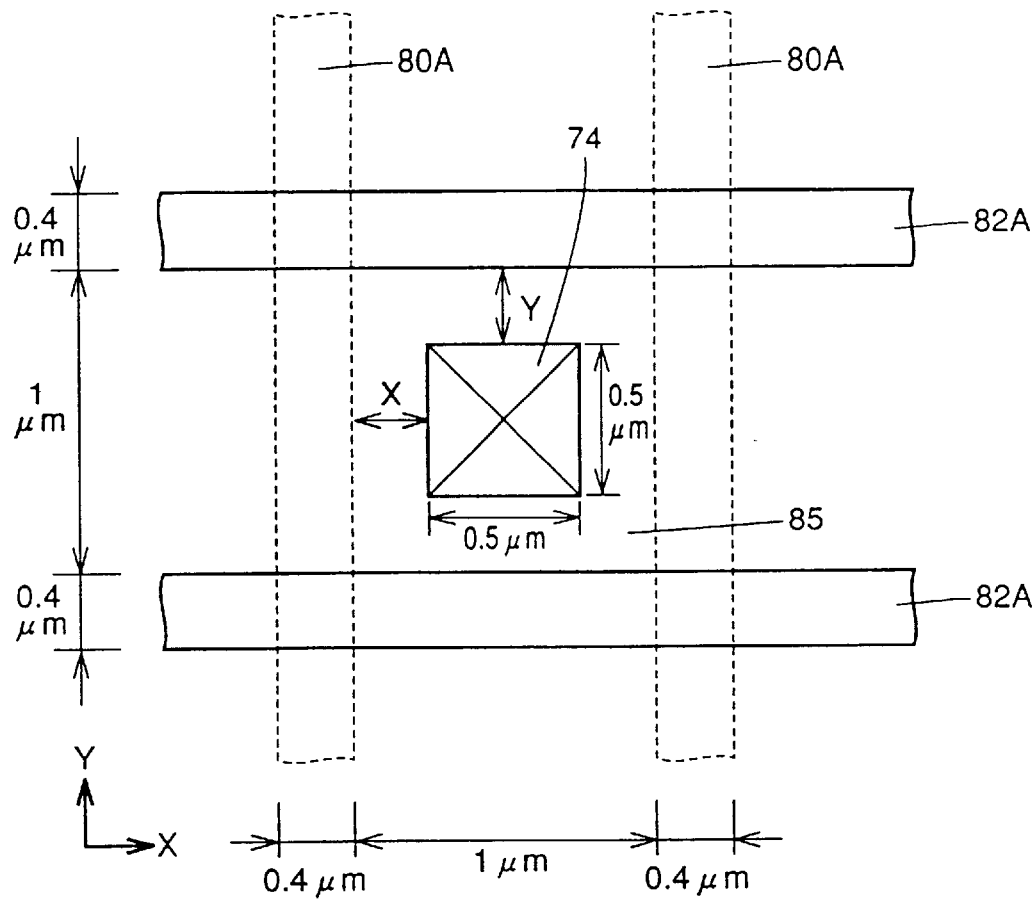
FIG. 55 is a plan view showing a contact hole formed in a region surrounded by word lines and bit lines in the prior art.
Figure 56:
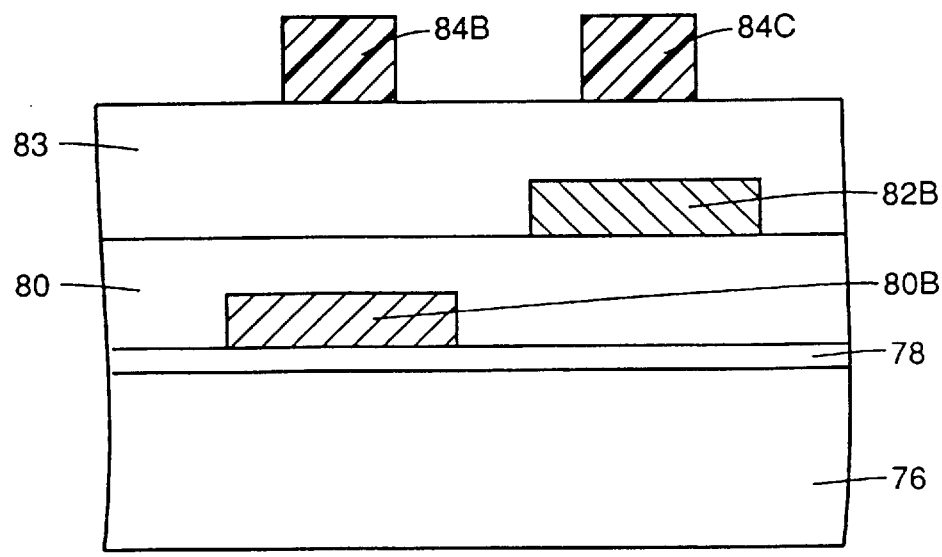
FIG. 56 is a cross section showing a structure of a conventional registration accuracy measurement mark.
Figure 57:
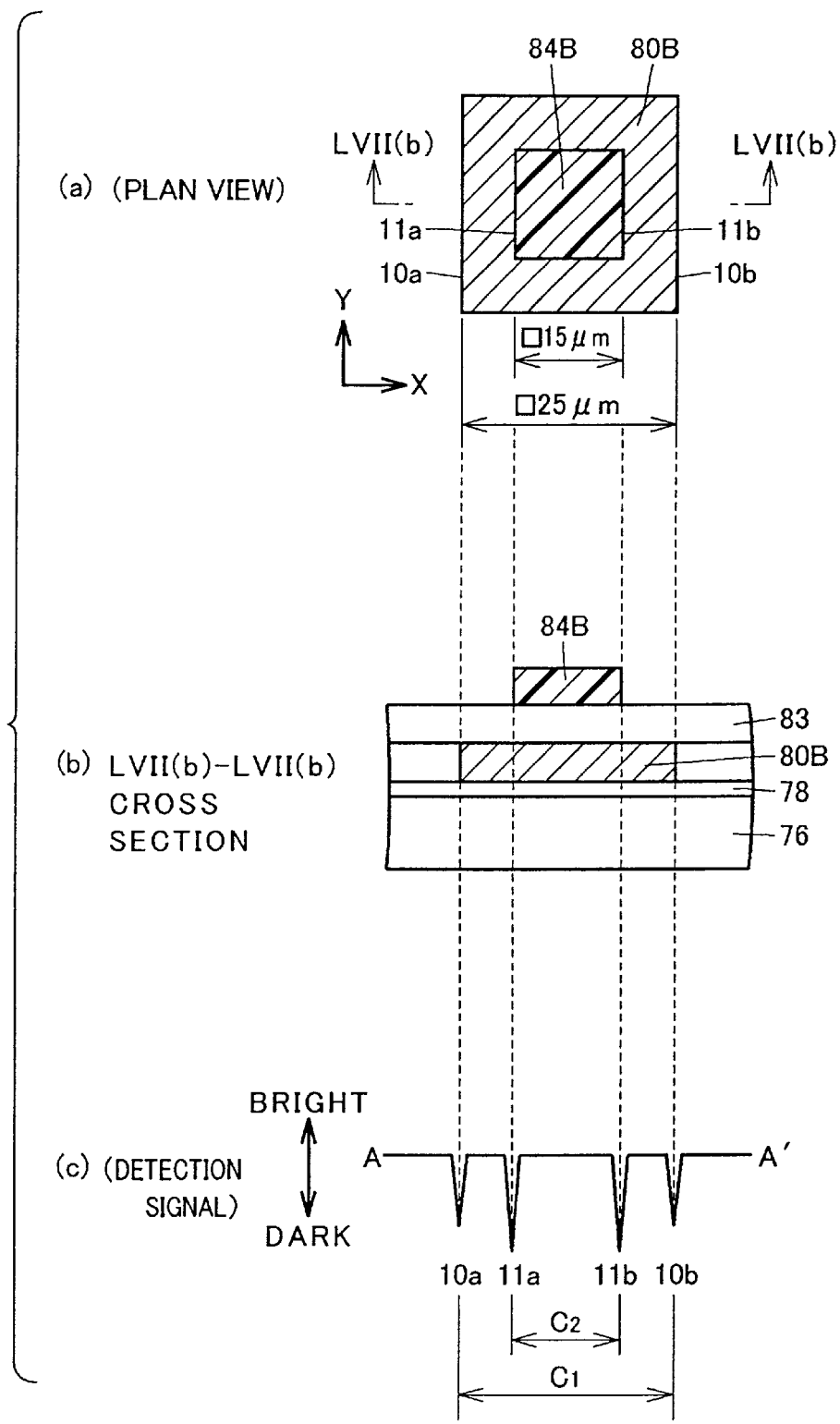
FIG. 57 shows a principle of the conventional registration accuracy measurement mark in which (a) is a plan view of the registration measurement mark, (b) is a cross section taken along the line LVII(b)—LVII(b) of (a) and (c) shows a detection signal corresponding to the cross section taken along the line LVII(b)—LVII(b) of (a).
Figure 58:
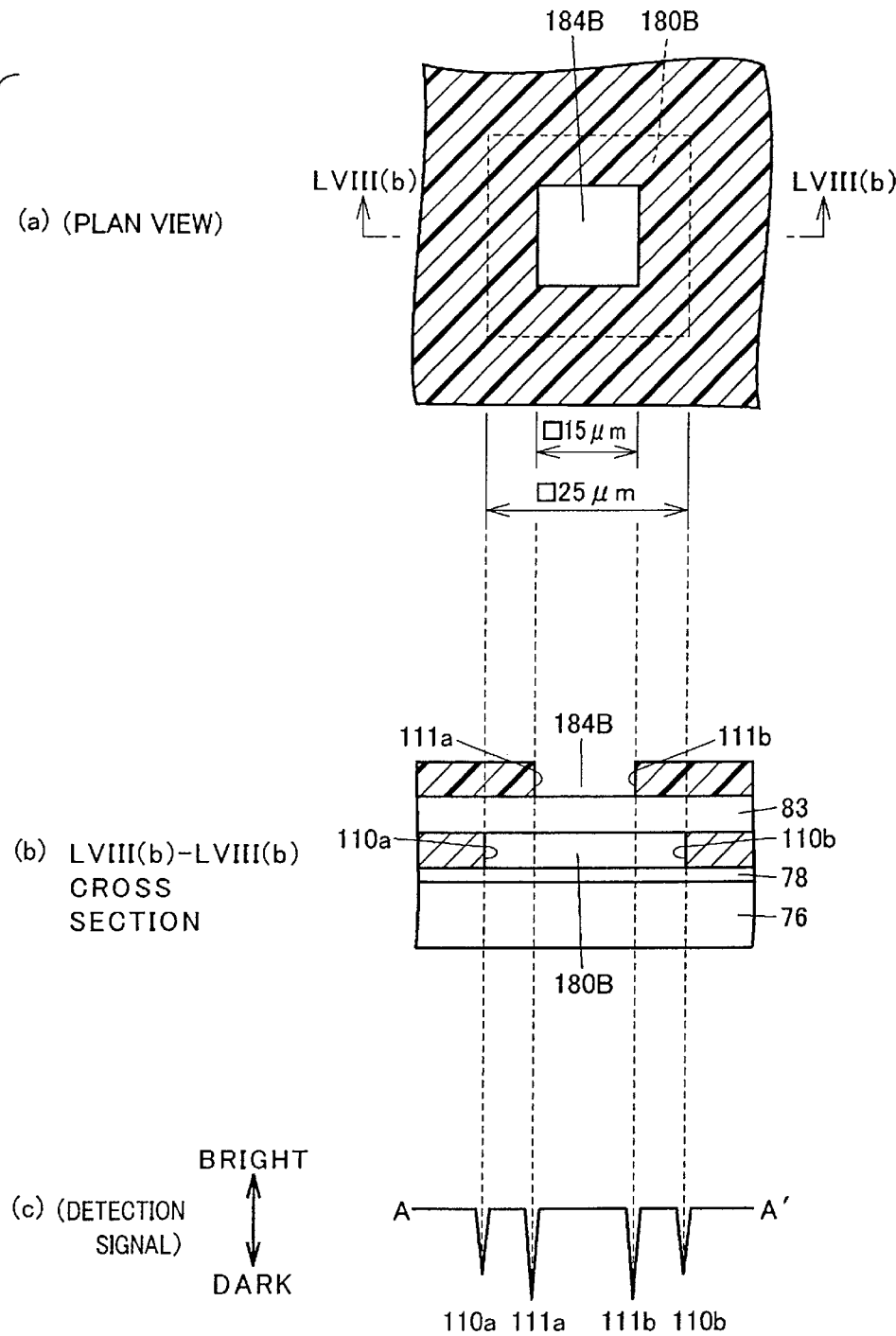
FIG. 58 shows a principle of operation of the registration accuracy measurement mark for a negative pattern corresponding to FIG. 57, in which (a) is a plan view of the registration accuracy measurement mark, (b) shows a cross section taken along the line LVII(b)—LVII(b) of (a), (c) shows a detection signal corresponding to the cross section taken along the line LVII(b)—LVII(b) of (a).
Figure 59:
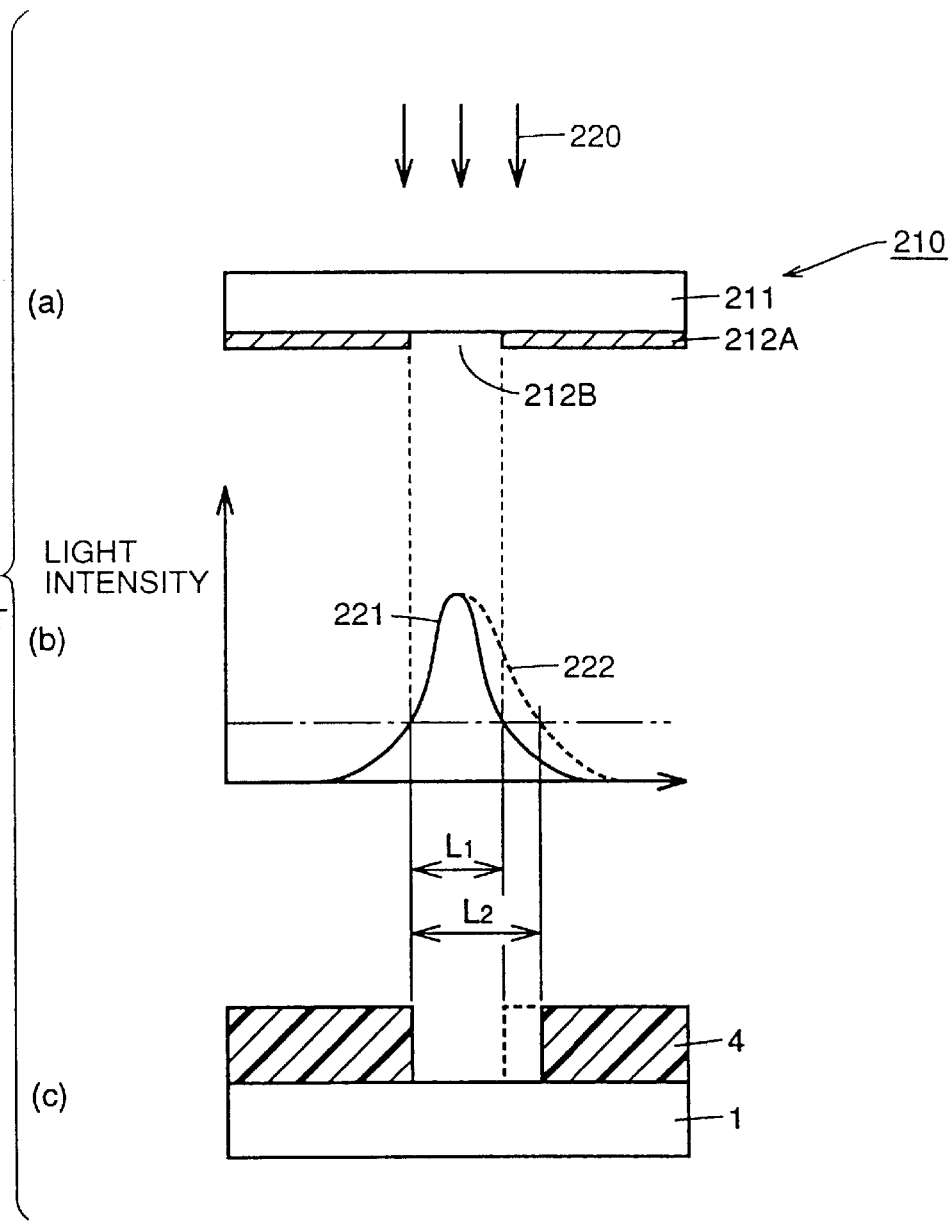
FIGS. 59 to 61 are first to third illustrations showing problems of comatic aberration.
Figure 60:
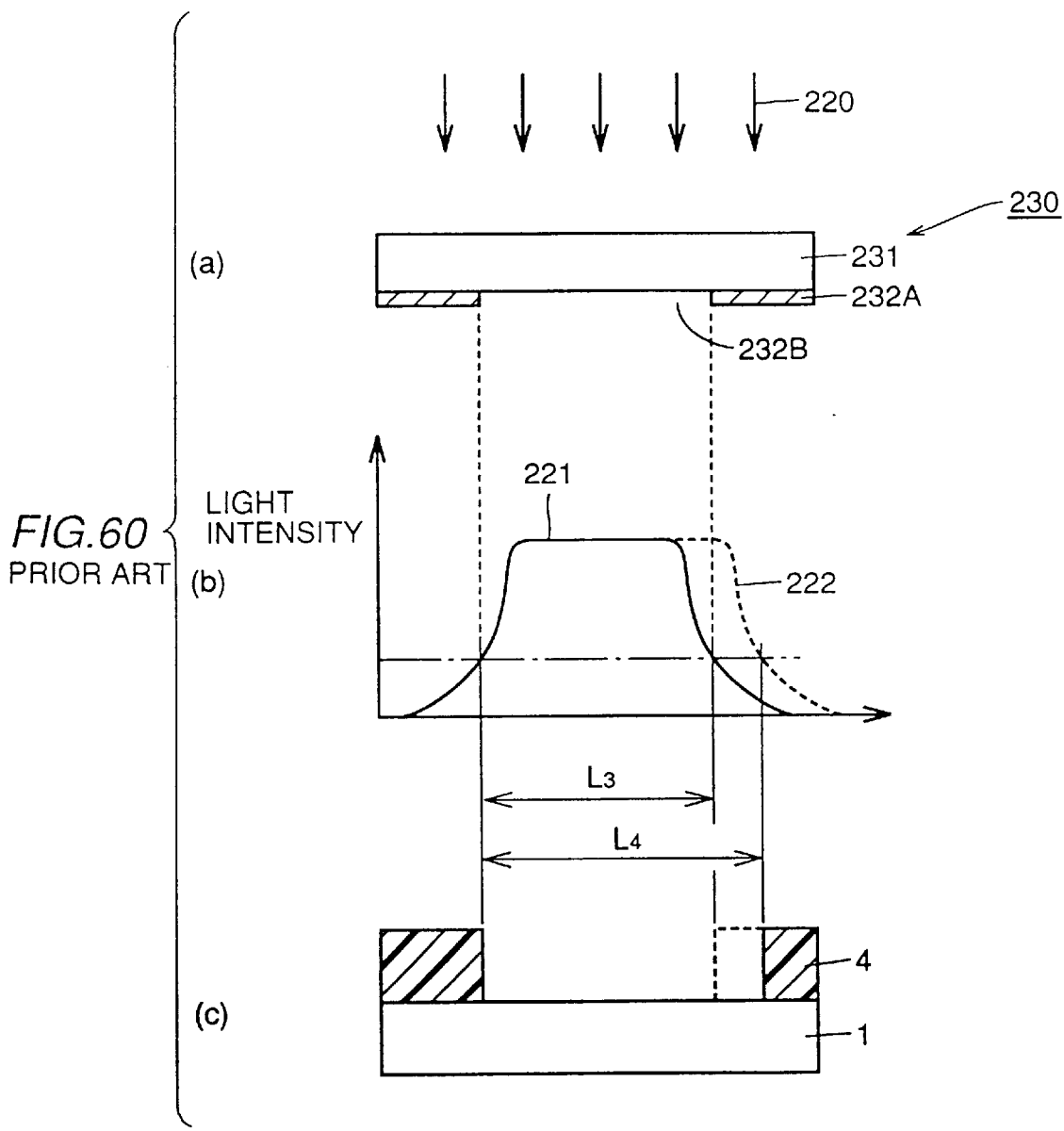
Figure 61:
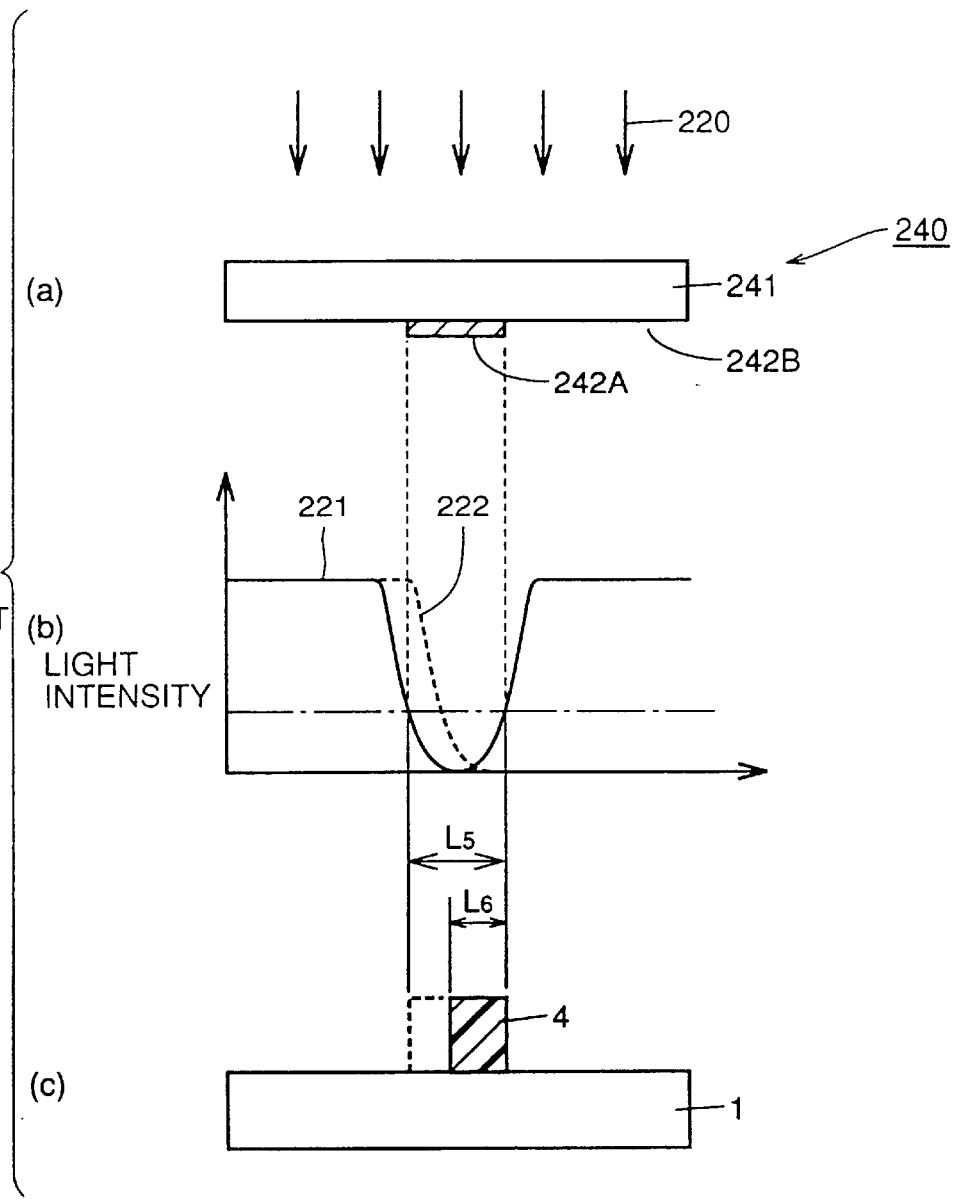
Figure 64:
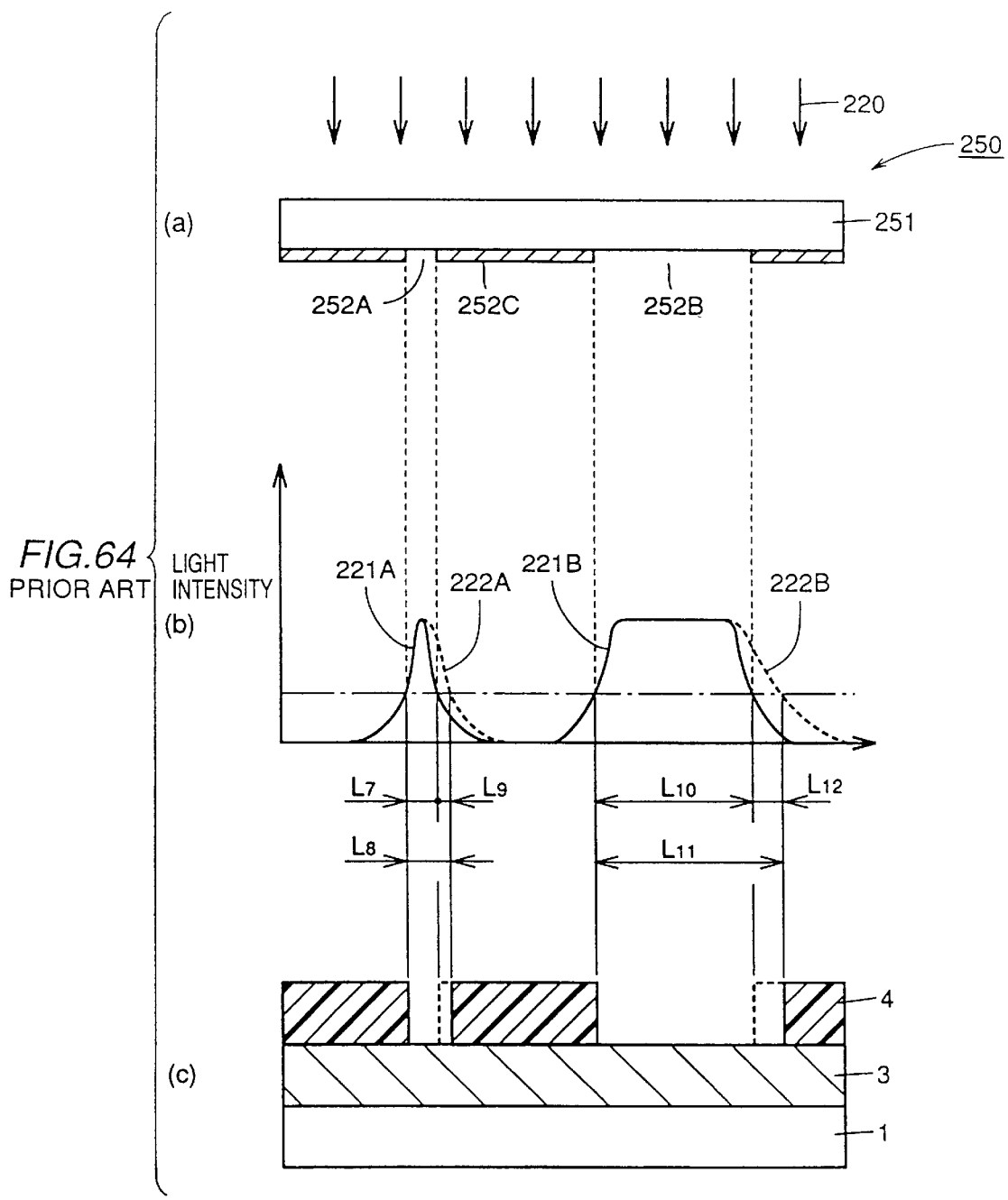
FIG. 64 shows a problem of comatic aberration caused in a conventional photomask.

It is assumed that the registration error measurement mark is for measuring registration error between word lines and a contact hole and between bit lines and a contact hole in the semiconductor device described with reference to FIG. 55.

First, referring to (a) and (b) of FIG. 1, the structure of a registration error measurement mark will be described. The first measurement mark 100 is formed on a semiconductor substrate 1 with an gate oxide film 2 interposed. The first measurement mark 100 includes auxiliary measurement pattern 100A having the width of 0.4 $\mu$m provided along the sides of 25 $\mu$m×25 $\mu$m square. The first measurement mark is a positive pattern.

The second measurement mark 200 is formed above the first measurement mark 100 with an interlayer oxide film 3 interposed. The second measurement mark 200 is prepared by arranging a plurality of negative patterns 200A each having the size of 0.5 $\mu$m×0.5 $\mu$m along the sides of a 15 $\mu$m×15 $\mu$m square.

The width of the auxiliary measurement pattern 100A of first measurement mark 100 is set to be 0.4 $\mu$m, which corresponds to the line width of the word line or the bit line. Accordingly, the influence of comatic aberration on the word line and the bit line is the same as the influence of comatic aberration on the first measurement mark 100. The pattern has a square shape of 25 $\mu$m×25 $\mu$m, because of the requirement of the registration inspecting apparatus, as already described in the section of prior art.

The auxiliary measurement pattern 100A is a positive line pattern, hence the word lines and bit lines formed on the semiconductor device are lines having positive patterns.

The auxiliary measurement pattern 200A constituting the second measurement mark 200 is adapted to be a hole pattern having the size of 0.5 $\mu$m×0.5 $\mu$m since the size of the contact hole formed in the semiconductor device is 0.5 $\mu$m×0.5 $\mu$m, and it has a hole pattern. The auxiliary measurement pattern 200A is arranged in a square of 15 $\mu$m×15 $\mu$m, in accordance with the requirement of the registration inspecting apparatus.

When the first and second measurement marks 100 and 200 structured as described above are used, the detection signal observed would be as shown in FIG. 1(c) which detection signal has the same comatic aberration as the word lines, bit lines and the contact hole formed in the semiconductor device.

Therefore, the amount of deviation between the center $A_1$ of detection signals 100a and 100a' and the center $A_2$ of detection signals 200a and 200a' is in one to one correspondence to the amount of deviation between the word line and a contact hole and between the bit line and a contact hole.

As described above, according to the present embodiment, the data based on the detection signals obtained by the first and second measurement marks 100 and 200 exactly reflects the relation of positional deviation between the bit lines and the contact hole and between the word lines and the contact hole constituting the semiconductor device.

As a result, highly reliable result of registration error measurement can be obtained, and hence the semiconductor device of high performance can be obtained.

Though measurement of registration error has been described in the present embodiment, the marks may be used as alignment marks, and similar effects can be obtained.

Though the size of the auxiliary measurement patterns 100A and 200A are adapted to be the same as the size of the word lines, bit lines and the contact hole, the size of the auxiliary measurement marks may be set in a range of from one half to double the size of the object of which registration error is to be measured, since within this range, the influence of comatic aberration is approximately the same.

(Embodiment 2)

A second embodiment of the present invention will be described with reference to FIGS. 2 to 8.

The second embodiment lists patterns of the first and second measurement marks of the first embodiment. FIGS.

Figure 6:
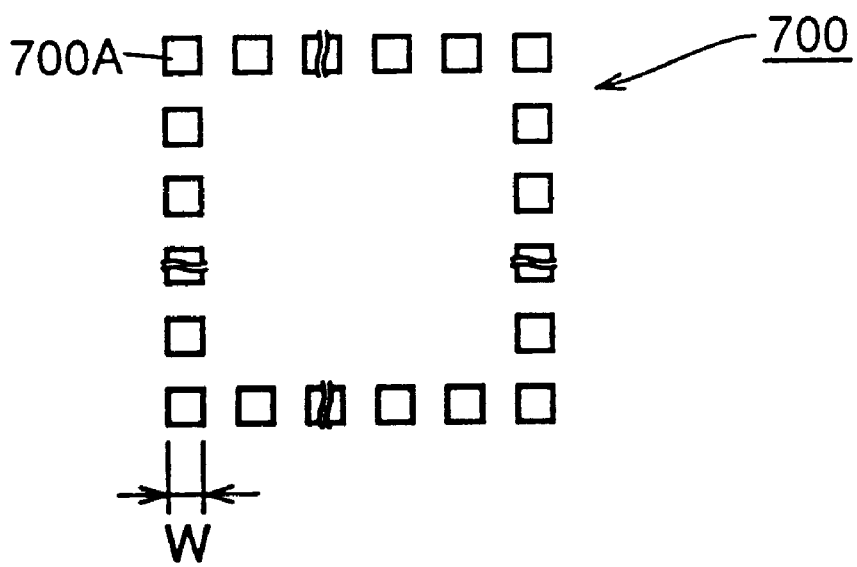
Figure 7:
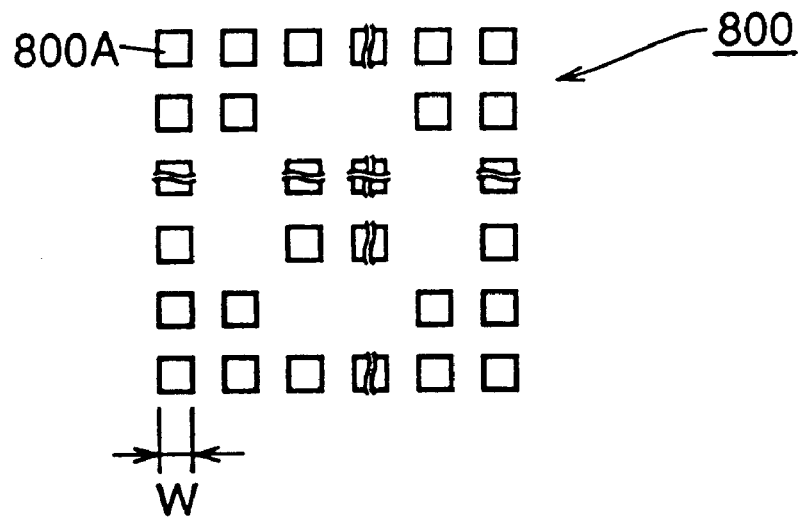
Figure 8:
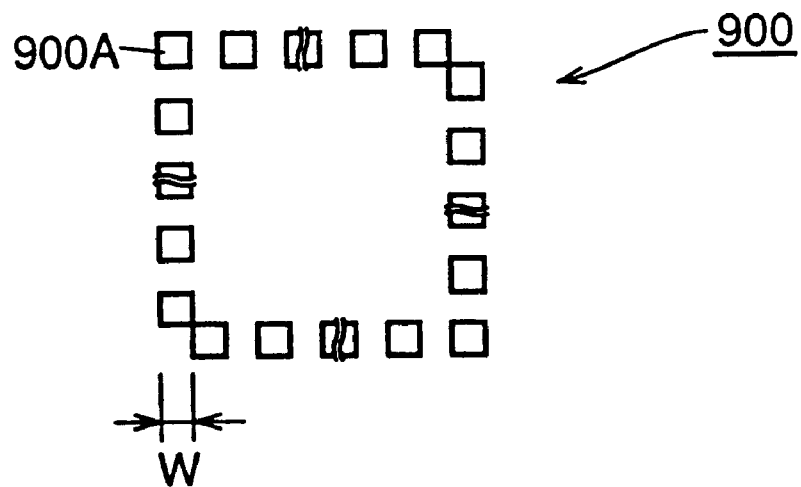

2 to 5 show the shapes of the first or second measurement marks constituted by line patterns, while FIGS. 6 to 8 show shapes of the first and second measurement marks constituted by hole patterns.

The measurement marks shown in FIGS. 2 to 8 may be positive or negative patterns.

Figure 2:
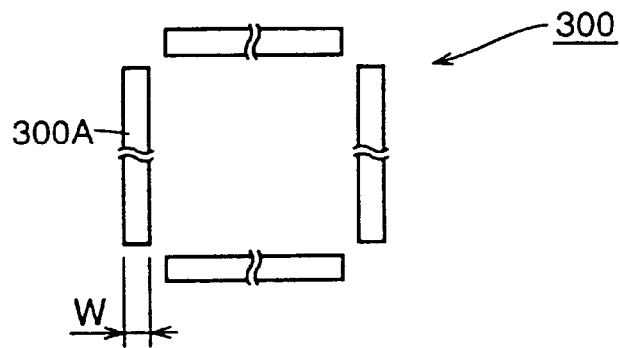
FIGS. 2 to 8 are first to seventh plan views of the registration accuracy measurement mark in accordance with a second embodiment of the present invention.

First, referring to FIG. 2, a measurement mark 300 is shown. The measurement mark 300 includes auxiliary measurement patterns 300A arranged at four sides of a virtual rectangle and auxiliary measurement patterns are not provided at corners of the rectangle.

Figure 3:
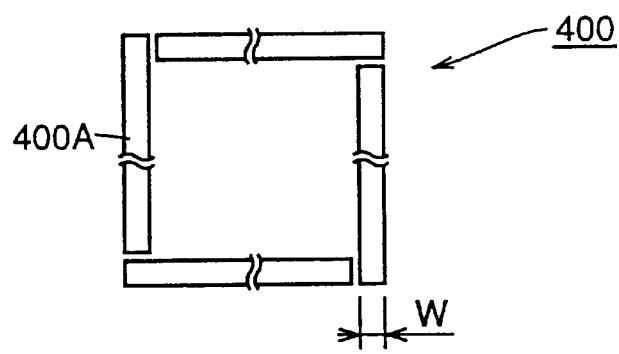

FIG. 3 shows a measurement mark 400. The measurement mark 400 includes auxiliary measurement patterns 400A arranged on four sides of a virtual rectangle, and the auxiliary measurement patterns 400A exist even at the corners of the rectangle.

Figure 4:
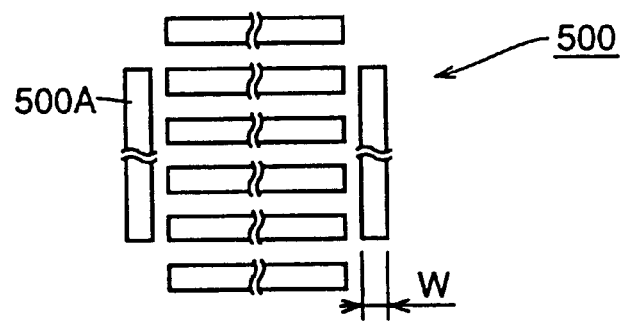

FIG. 4 shows a measurement mark 500. The measurement mark 500 includes auxiliary measurement marks 500A arranged along a pair of opposing sides of the virtual rectangle, and auxiliary measurement marks 500A are arranged parallel to a side orthogonal to the aforementioned opposing sides, so as to fill the inside of the virtual rectangle.

Figure 5:
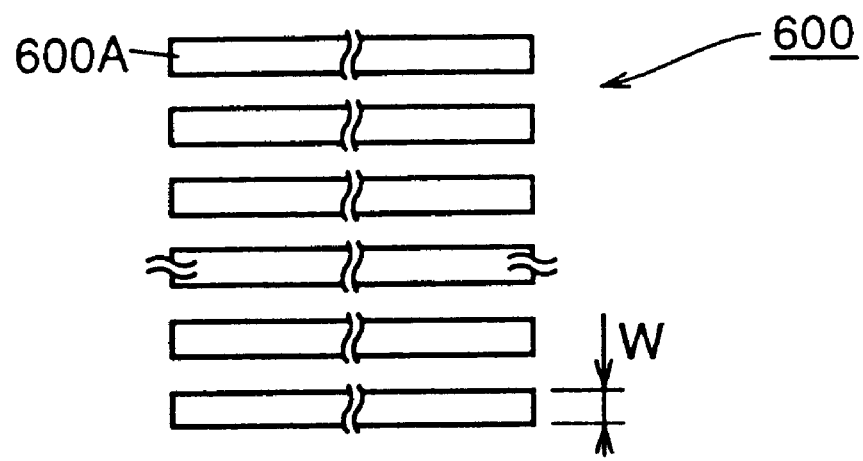

FIG. 5 shows a measurement mark 600. The measurement mark 600 includes a plurality of auxiliary-measurement marks 600A arranged parallel to a side orthogonal to the aforementioned opposing sides, so as to fill the inside of the virtual rectangle.

The measurement marks 500 and 600 may be used rotated by 90° from the states shown in FIGS. 4 and 5 to obtain the same effect.

The width W of the line pattern of the measurement marks 300 to 600 should preferably be within the range of from one half to double the width of the semiconductor element forming member of which registration error is to be measured.

FIG. 6 shows a measurement mark 700. The measurement mark 700 includes a plurality of auxiliary measurement patterns 700A of hole patterns, along four sides of the virtual rectangle.

FIG. 7 shows a measurement mark 800. The measurement mark 800 includes a plurality of auxiliary measurement patterns 800A, which are hole patterns, along four sides and diagonals of the virtual rectangle.

FIG. 8 shows a measurement mark 900. The measurement mark 900 is a modification of measurement mark 700. Auxiliary measurement marks 900A are arranged along four sides of virtual rectangle. However, at the corners of the virtual rectangle, the auxiliary measurement patterns 900A are arranged only at a pair of opposing corners.

By using measurement marks of various patterns shown in FIGS. 2 to 8, similar effects as the first embodiment can be obtained in measuring registration error.

(Embodiment 3)

A third embodiment of the present invention will be described with reference to FIGS. 9 to 16. In the third embodiment, the method of repairing defects of the registration error measurement mark will be described.

First, referring to FIGS. 9 and 10, a method of repairing defects in a registration error measurement mark 301, which includes negative line patterns, will be described.

Figure 9:
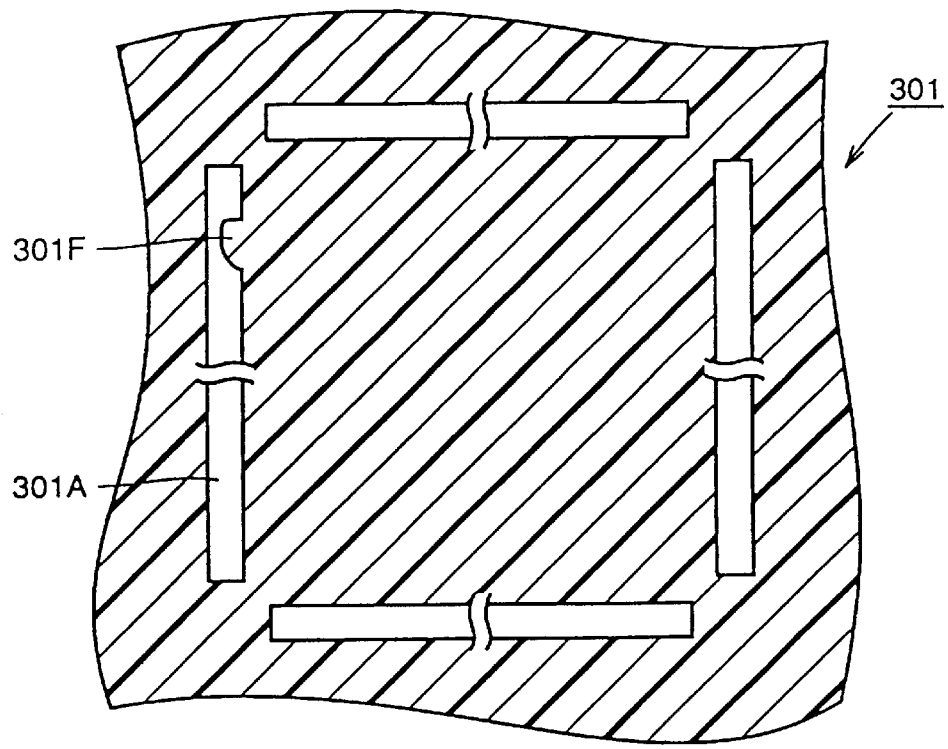
FIGS. 9 to 16 are first to eighth steps of repairing defects of registration accuracy measurement marks in accordance with a third embodiment of the present invention.
Figure 10:
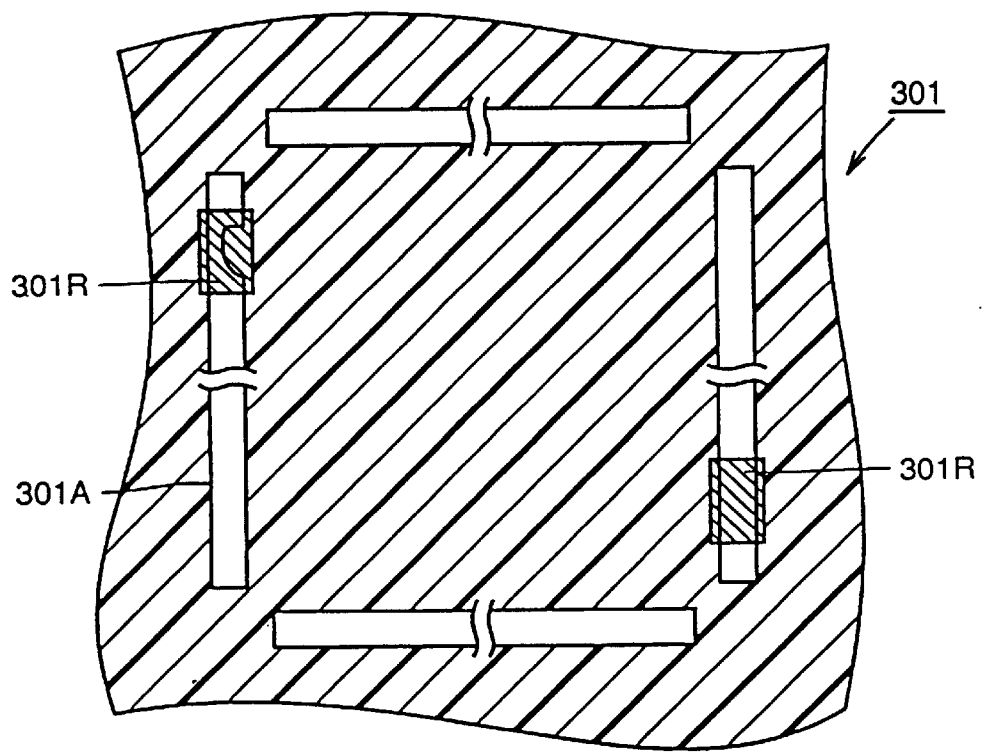

Referring to FIG. 9, there is a defect 301F at a part of an auxiliary measurement mark 301A of measurement mark 300. The defect in a negative pattern is repaired by filling the defect 301F with carbon 301R by focused ion beam or the like. At the same time, another auxiliary measurement pattern 301A, which is in point symmetry with respect to the intersection of the diagonals of the virtual rectangle, is repaired.

By such a repairment, symmetry of the measurement mark is ensured, and hence the measurement mark can be surely recognized by the registration inspecting apparatus. As a result, unsatisfactory measurement of registration error caused by the erroneous recognition of the measurement mark can be avoided.

Figure 11:
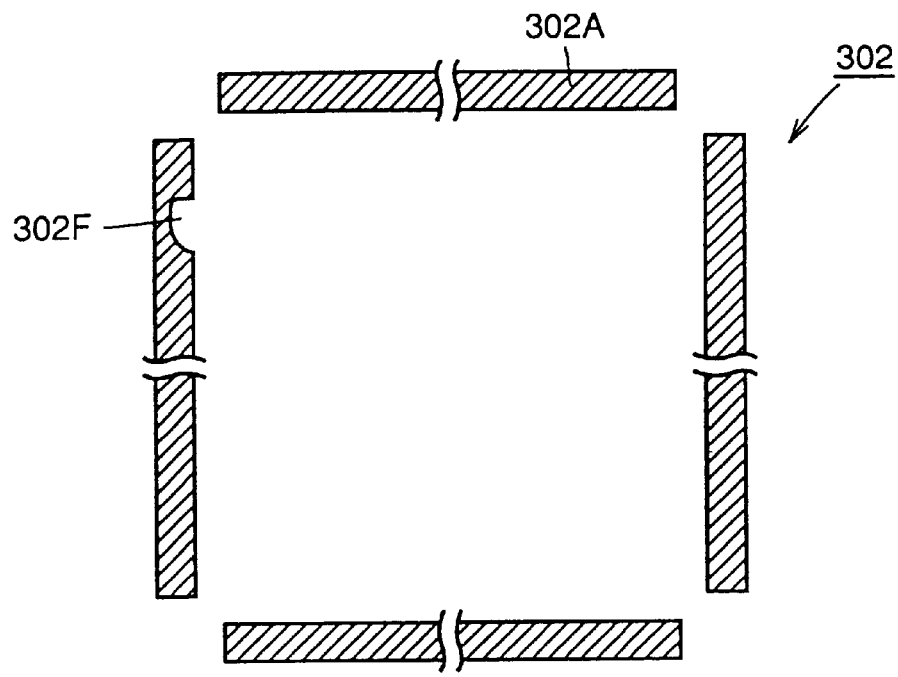
Figure 12:
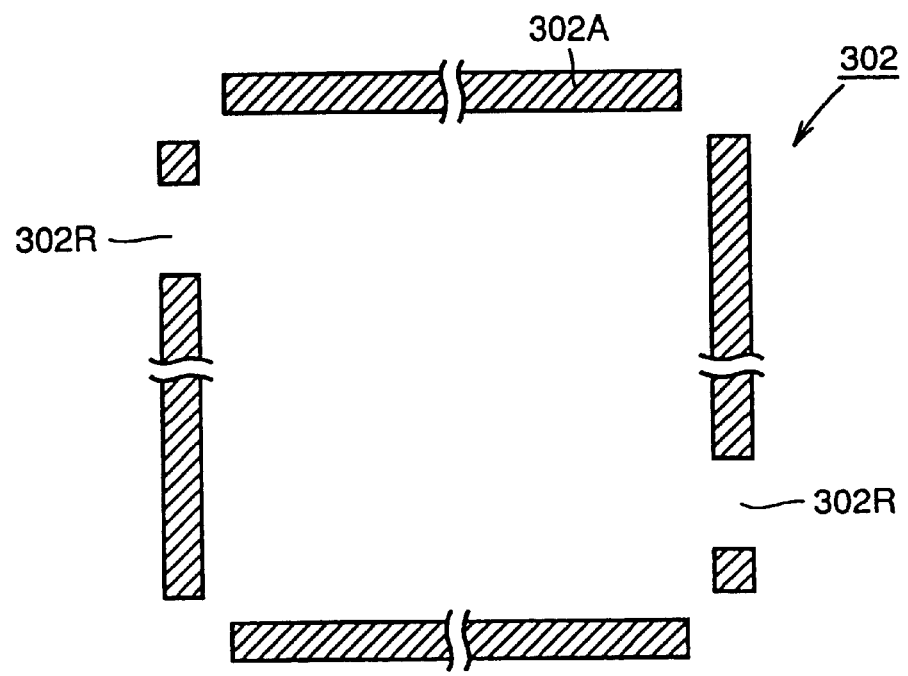

Referring to FIGS. 11 and 12, repairment of a defect in a registration error measurement mark 302 which includes positive line patterns will be described.

As shown in FIG. 11, there is a defect 302F at a part of auxiliary measurement mark 302A of measurement mark 302. The defect of a positive pattern is repaired by removing the defect 302F by laser or the like as shown in FIG. 12, so as to leave 302R, and auxiliary measurement mark 302A on the opposite side is similarly processed, which mark is in point symmetry with respect to the intersection of the diagonals of the virtual rectangle. Accordingly, as already described, symmetry of the measurement mark can be ensured.

Figure 13:
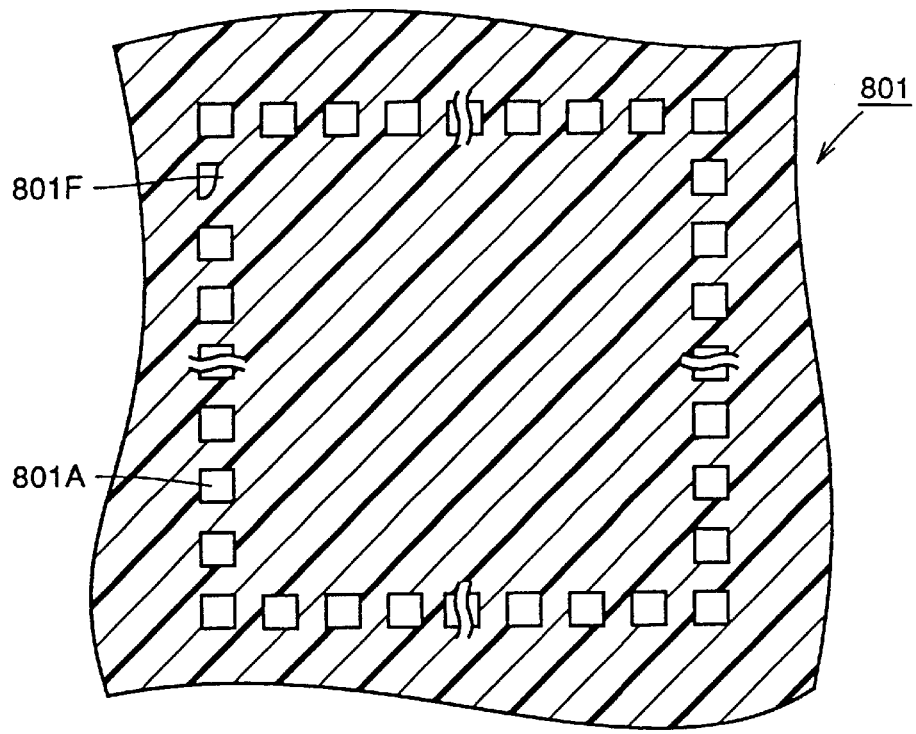
Figure 14:
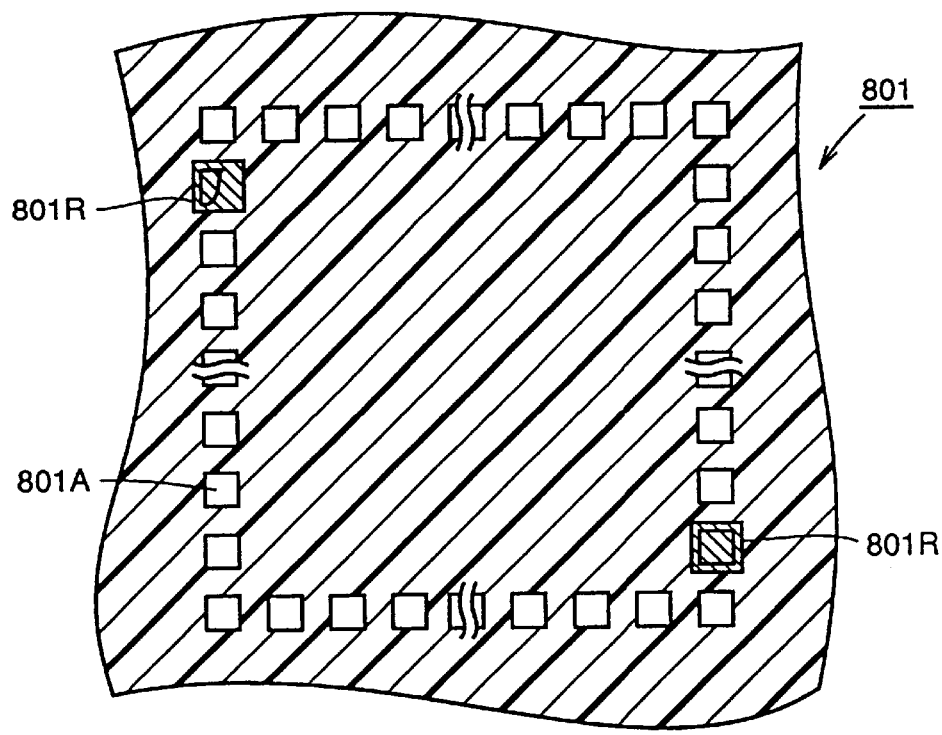

Referring to FIGS. 13 and 14, the method of repairing the defects of registration error measurement mark 801 including-negative hole patterns will be described.

Referring to FIG. 13, there is a defect 801F at a part of auxiliary measurement mark 801A of measurement mark 801. The defect of a negative pattern is filled by carbon 801R by focused ion beam as shown in FIG. 14, and an auxiliary measurement mark 801A of the opposite side is similarly processed, which mark is in point symmetry with respect to the intersection of the diagonals of the virtual rectangle. Accordingly, symmetry of the measurement mark is ensured, as already described.

Figure 15:
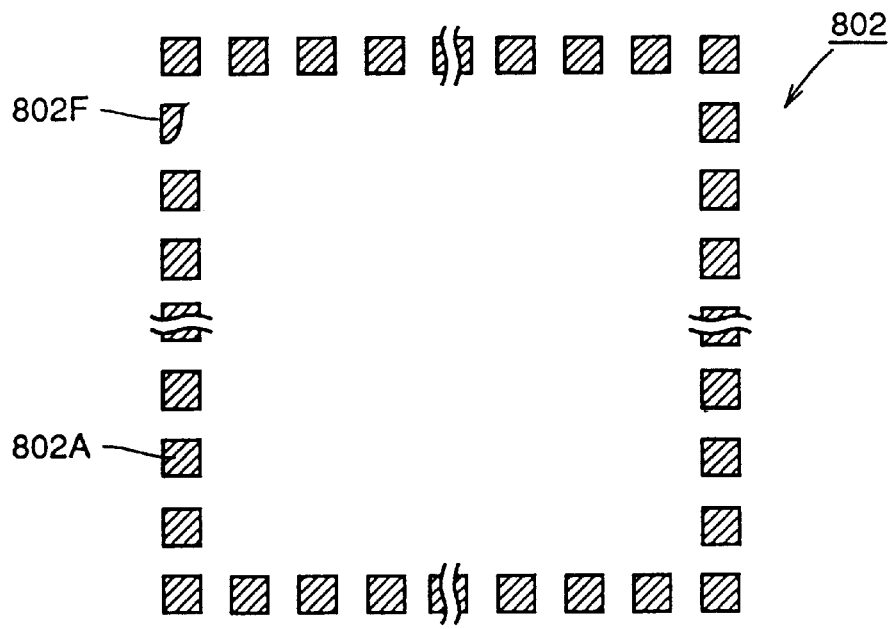
Figure 16:
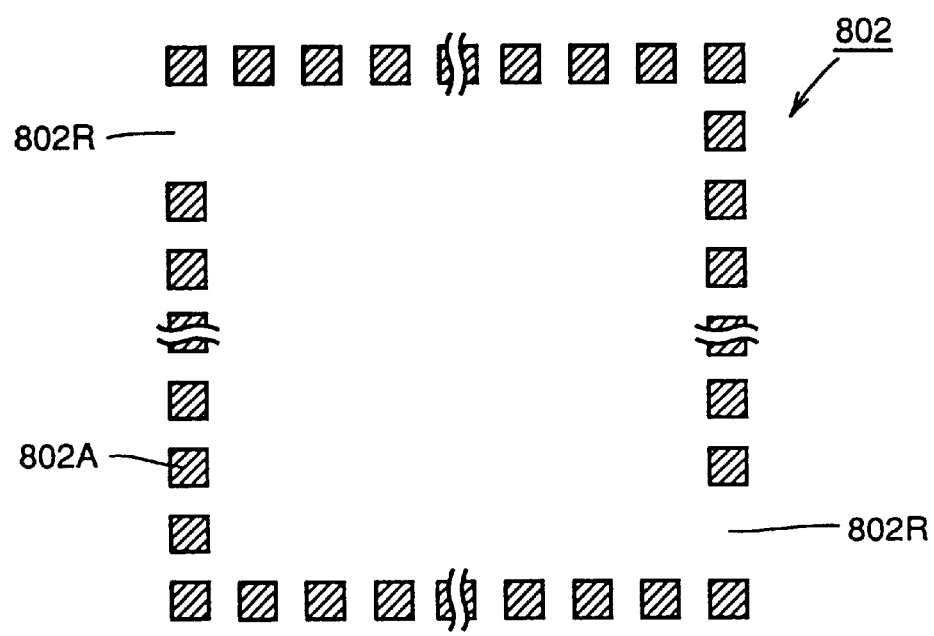

Referring to FIGS. 15 and 16, the method of repairing defects of a registration measurement mark 802 including positive hole patterns will be described.

Referring to FIG. 15, there is a defect 802F at a part of auxiliary measurement mark 802A of measurement mark 802. The defect of a positive pattern is repaired by removing the defect 802F by laser as shown by 802R of FIG. 16. At the same time, an auxiliary measurement mark 802A which is on the opposite side and in point symmetry with respect to the intersection of diagonals of the virtual rectangle is similarly processed. This ensures symmetry of measurement marks as already described.

Though the first to third embodiments above have been described with reference to registration error measurement marks, the present invention can also be applied to alignment marks and similar effects can be obtained.

(Embodiment 4)

A fourth embodiment of the present invention will be described with reference to FIGS. 17 to 19. In the fourth embodiment, a method of manufacturing a photomask for forming, for example, the second registration error measurement mark 200 described in the first embodiment, will be described.

The photomask is not limited to a normal photomask but it includes phase shift masks and attenuation type phase shift masks.

In this embodiment, a method of manufacturing an attenuation type phase shift mask will be described as an example.

Figure 17:
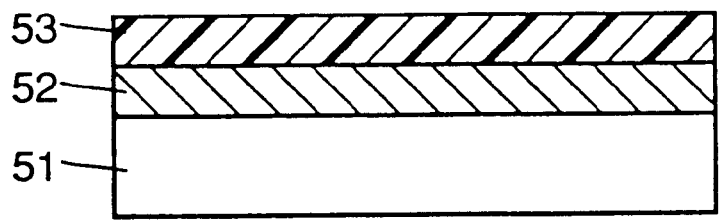
FIGS. 17 to 19 show first to third steps of manufacturing a photomask in accordance with a fourth embodiment of the present invention.

First, referring to FIG. 17, on a transparent substrate 51 formed of quartz, for example, a shifter film for controlling transmissivity and phase angle of exposure light is formed. The shifter film may be formed of MoSiO, CrO or CrON.

On the shifter film 52, an electron beam resist film 53 is formed.

Figure 18:
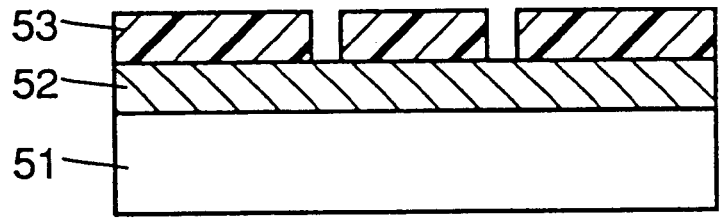

Then, referring to FIG. 18, the electron beam resist film 53 is irradiated with an electron beam, so that a pattern corresponding to the second registration error measurement mark is exposed and developed.

Figure 19:
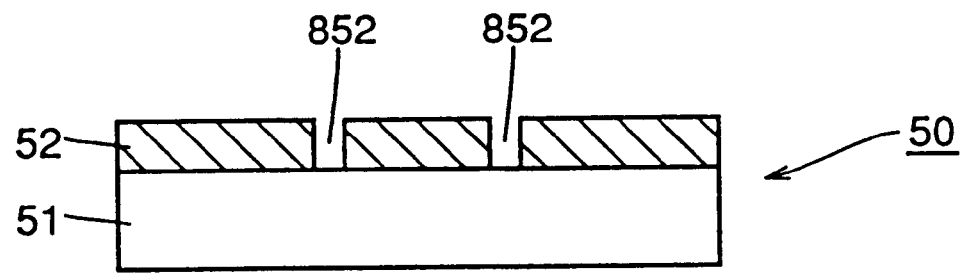

Then, referring to FIG. 19, using resist film 53 as a mask, reactive ion etching using $CF_4+O_2$ gas is performed so that the shifter film 52 is etched, and light transmitting portion 852 corresponding to the auxiliary measurement pattern is formed. Thereafter, resist film 53 is removed, and thus photomask 50 is completed.

Figure 20:
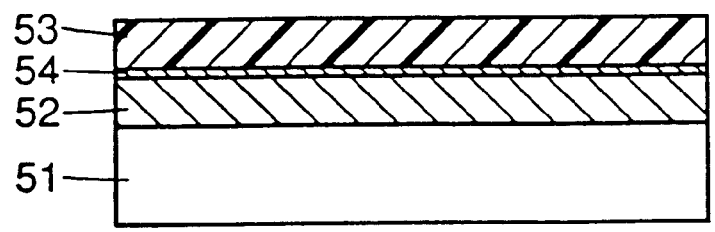
FIG. 20 shows another step of manufacturing showing the photomask in accordance with the fourth embodiment of the present invention.

In the manufacturing process shown in FIGS. 17 to 19, the shifter film 52 has been described as processed by using resist pattern 53. However, it may be formed to have a thin film 54 such as Mo or Cr film as a conductive film or a Cr film used as light intercepting film formed on shifter film 52, between shifter film 52 and resist film 53, as shown in FIG. 20, for example.

Figure 21:
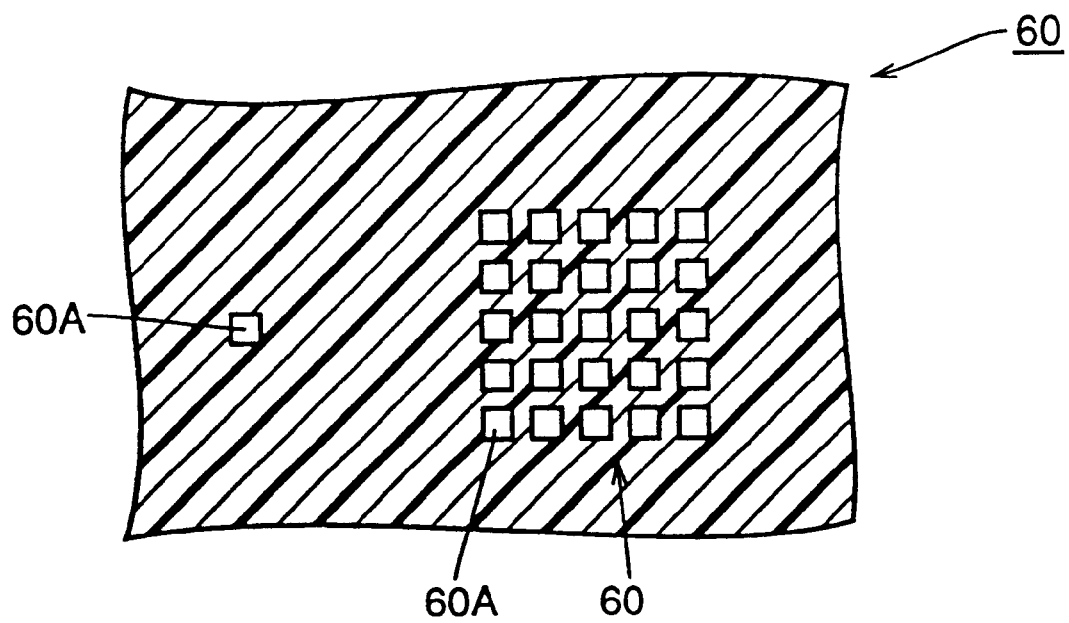
FIG. 21 is a plan view showing another application of the photomask in accordance with the fourth embodiment of the present invention.

Though the method of manufacturing a photomask for forming registration accuracy measurement mark has been described, the present invention is not limited to this, and a photomask taking into consideration the comatic aberration can be manufactured in a common semiconductor device as shown in FIG. 21.

For example, referring to the plan view of the photomask shown in FIG. 21, the photomask includes a first region 60 having a first pattern 60A, and a second region 61 having a second pattern including a plurality of first patterns 60A combined.

In this photomask, the second pattern in the second region 61 is constituted by the first patterns 60A which are negative patterns, and therefore the influence of comatic aberration on the first and second regions 60 and 61 is the same.

As a result, in a photomask having a pattern considering aberration, the first and second regions may be corrected similarly, and so that a photomask of high performance can be obtained.

The phase shift mask in accordance with the present invention may have the following disadvantage.

Figure 1:
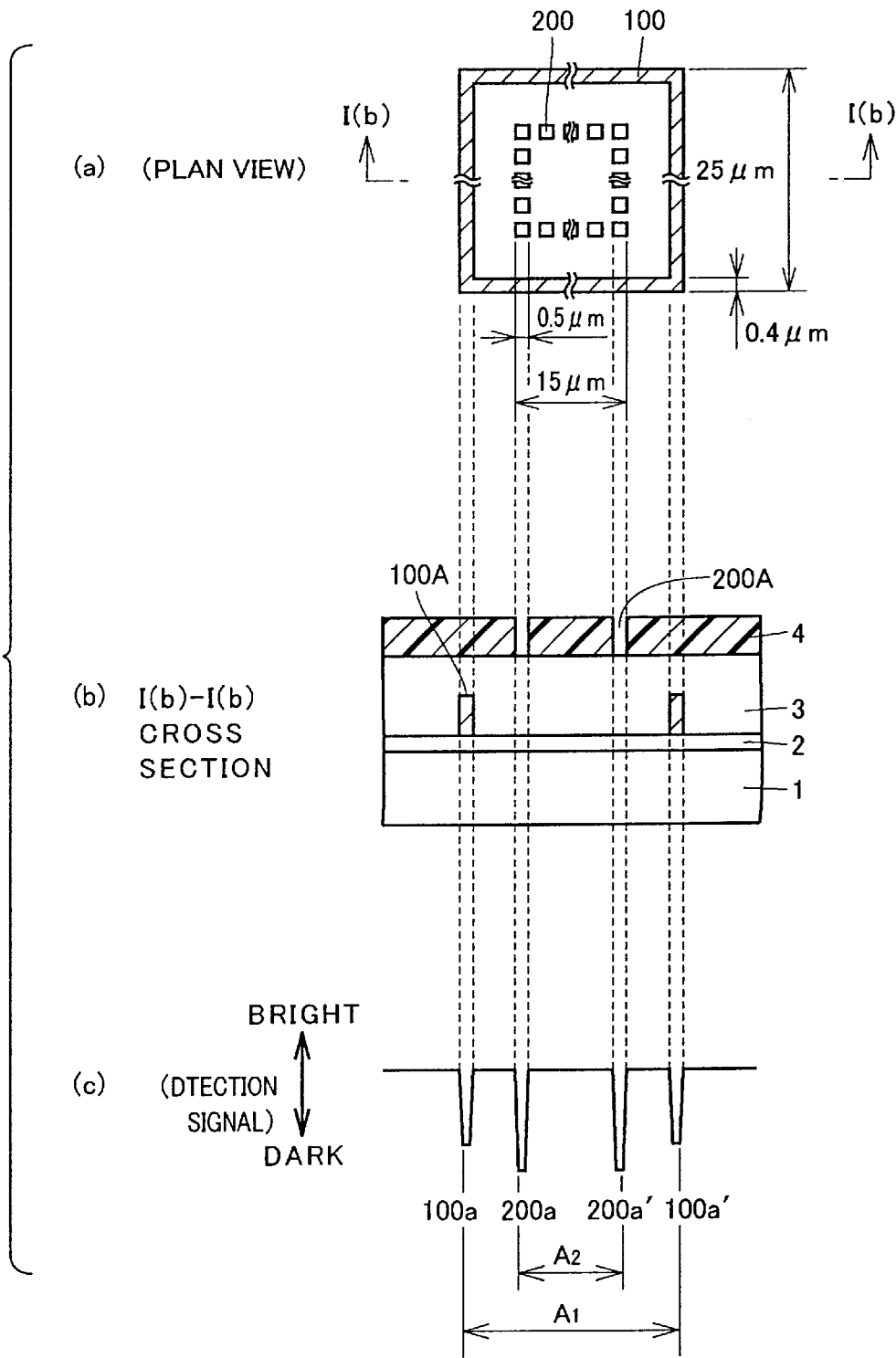
FIG. 1 is an illustration showing the principle of registration error measurement in accordance with a first embodiment of the present invention, in which (a) is a plan view of the registration error measurement mark, (b) is a cross section taken along the line I(b)—I(b) of (a), and (c) shows a detection signal corresponding to the cross section taken along I(b)—I(b) of (a).

Referring to FIG. 22, assume that resist film 4 is exposed by using the attenuation type phase shift mask in accordance with the present invention with the second measurement mark 200 shown in FIG. 1, for example. Then, the mask pattern provided on phase shift mask 501 will be as shown in FIG. 22(a).

Therefore, the cross section of the pattern after wafer transfer would be as shown in FIG. 22(b).

Here, near the auxiliary pattern 200a of resist film 4, there is formed a portion 506 with reduced thickness in resist film 4, the plan view of the pattern after wafer transfer is as shown in FIG. 22(c), and hence a plurality of portions 506 with reduced thickness results in resist film 4.

As a result, the detection signal obtained from resist film 4 would be as shown in FIG. 22(d), in which the central position of the detection signal provided by the second measurement mark is shifted because of the detection signal 506a' measured at the portion 506 of reduced thickness, preventing accurate measurement.

Figure 23:
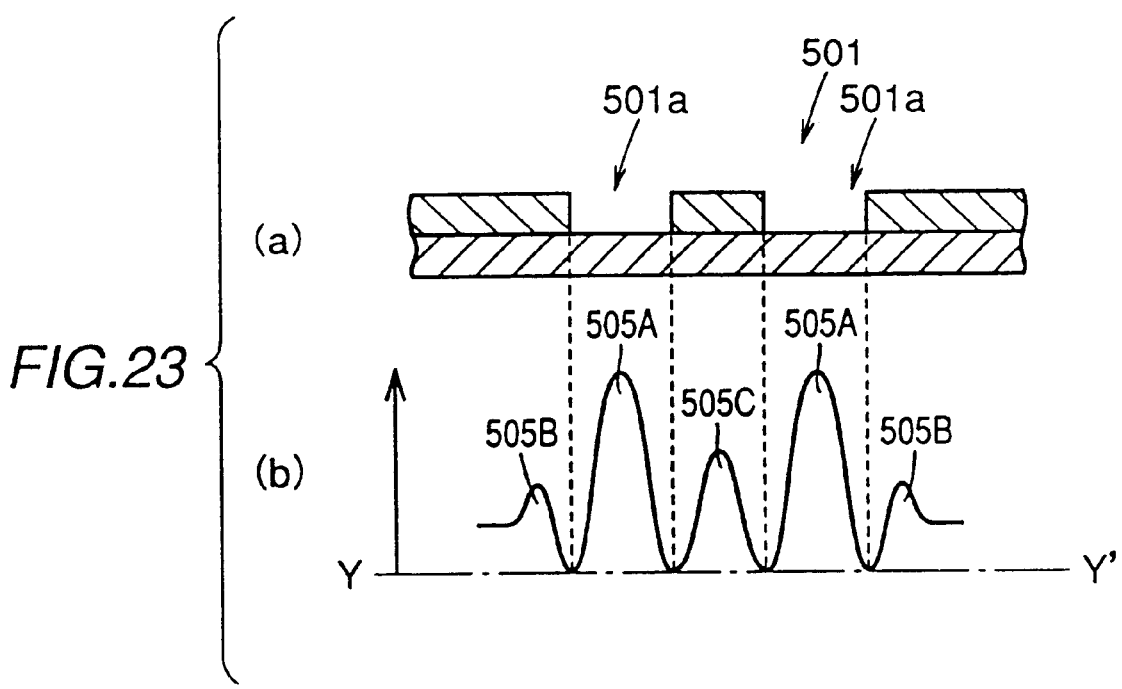
FIG. 23 shows a profile of light intensity corresponding to the cross section taken along the line Y–Y' XXII—XXII of FIG. 22(c).

When the profile of the exposure light along the line XXIII—XXIII of FIG. 22(c) is observed, the light which has passed through the light transmitting portion 501a of phase shift mask 501 exhibits high intensity 505A, and a side lobe 505B having a peak of light intensity caused by diffraction effect particular to the phase shift mask and dependent on the pattern pitch, pattern step, aberration of the lens of the exposure apparatus and fluctuation of the exposure energy is formed therearound, as shown in FIG. 23.

Further, dependent on the pattern pitch of light transmitting portion 501, it is possible that side lobes 505B are overlapped, forming a side lobe 505C having even higher intensity. The resist film would be reduced in thickness because of the light intensities of side lobes 505B and 505C.

By taking such a measure as shown in FIGS. 24 to 53, it is possible to prevent generation of portions reduced in thickness of the resist film.

Figure 24:
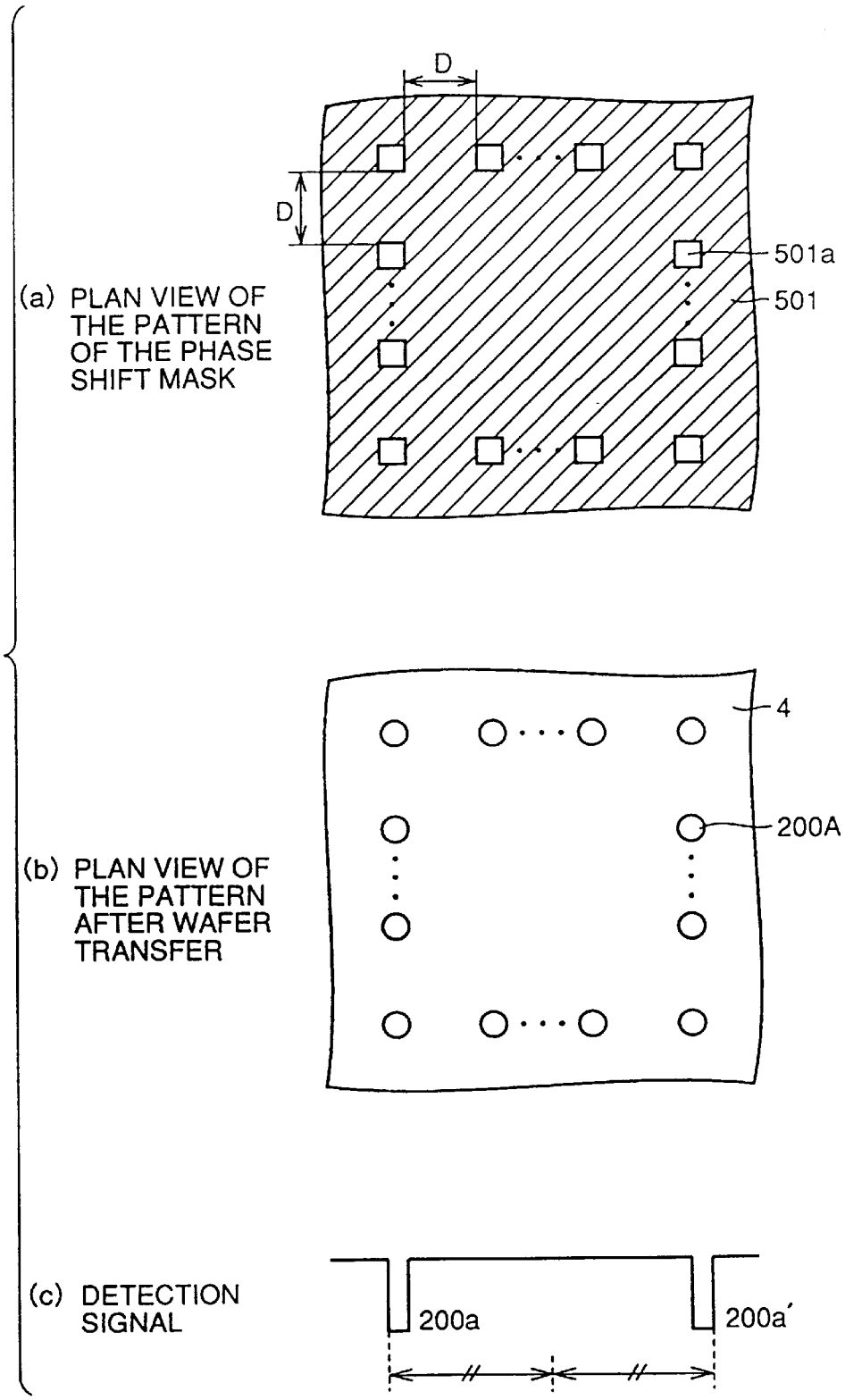
FIG. 24 shows a first example of the fourth embodiment in which (a) is a plan view of a mask pattern of the phase shift mask, (b) is a plan view of the pattern after wafer transfer, and (c) shows a detection signal.

The first example will be described with reference to FIG. 24.

In the plan view of the mask pattern of the phase shift mask 501 in accordance with the first example, the distance (D) between light transmitting portions 501a is adjusted such that side lobes generated at light transmitting portions 501a do not interfere with each other, as shown in FIG. 24(a).

For example, if the size of the light transmitting portion 501a is 0.5 μm and the wavelength of the exposure light source is i-line (365 μm), the distance (d) between light transmitting portions 501a should be at least 0.8 μm.

Therefore, when such a phase shift mask 501 as shown in FIG. 24(a) is used, the plan view of the pattern formed on the resist film 4 will be in accordance with the pattern of the phase shift mask 501 as shown in FIG. 24(b), and as a result, accurate detection signal can be obtained as shown in FIG. 24(c).

The second example will be described with reference to FIG. 25. In the phase shift mask 501 of the second example shown in FIG. 25(a), distance (D) between the light transmitting portions 501a is adjusted such that the positions where side lobes formed by the light transmitting portions 501a interfere with each other are generated on one line defined by light transmitting portions 501a.

In this case, there are portions 506 where the resist film 4 has its thickness reduced in the plan view of the pattern after wafer transfer as shown in FIG. 25(b). However, since it is on the same line as pattern 200a, it does not have any influence on detection signals 200a and 200a' as shown in FIG. 25(c). As a result, accurate detection signal can be obtained.

The third example will be described with reference to FIG. 26.

In the phase shift mask 501 of the third embodiment, in order to suppress generation of the side lobe by the light transmitting portion 501a, an auxiliary pattern 501b of which size is not larger than the resolution limit of the exposure light source is provided at a position where the side lobe would otherwise be generated, as shown in the mask pattern plan view of the phase shift mask 501 of FIG. 26(a).

In the phase shift mask 501 of the third example, the distance (D) between the light transmitting portions 501a is preferably in the range of about 0.6 to 0.8 μm when the size of the light transmitting portion 501a is about 0.5 μm and the wavelength of the light source of the exposure apparatus is i-line (365 μm), though it depends on the wavelength of the light source of the exposure apparatus and on the parameters of the optical system. As for the size (S) of the auxiliary pattern 501b, it should be about 0.25 μm at most, though it depends on the parameters of the optical system and on the transmissivity of the phase shift mask.

Figure 27:
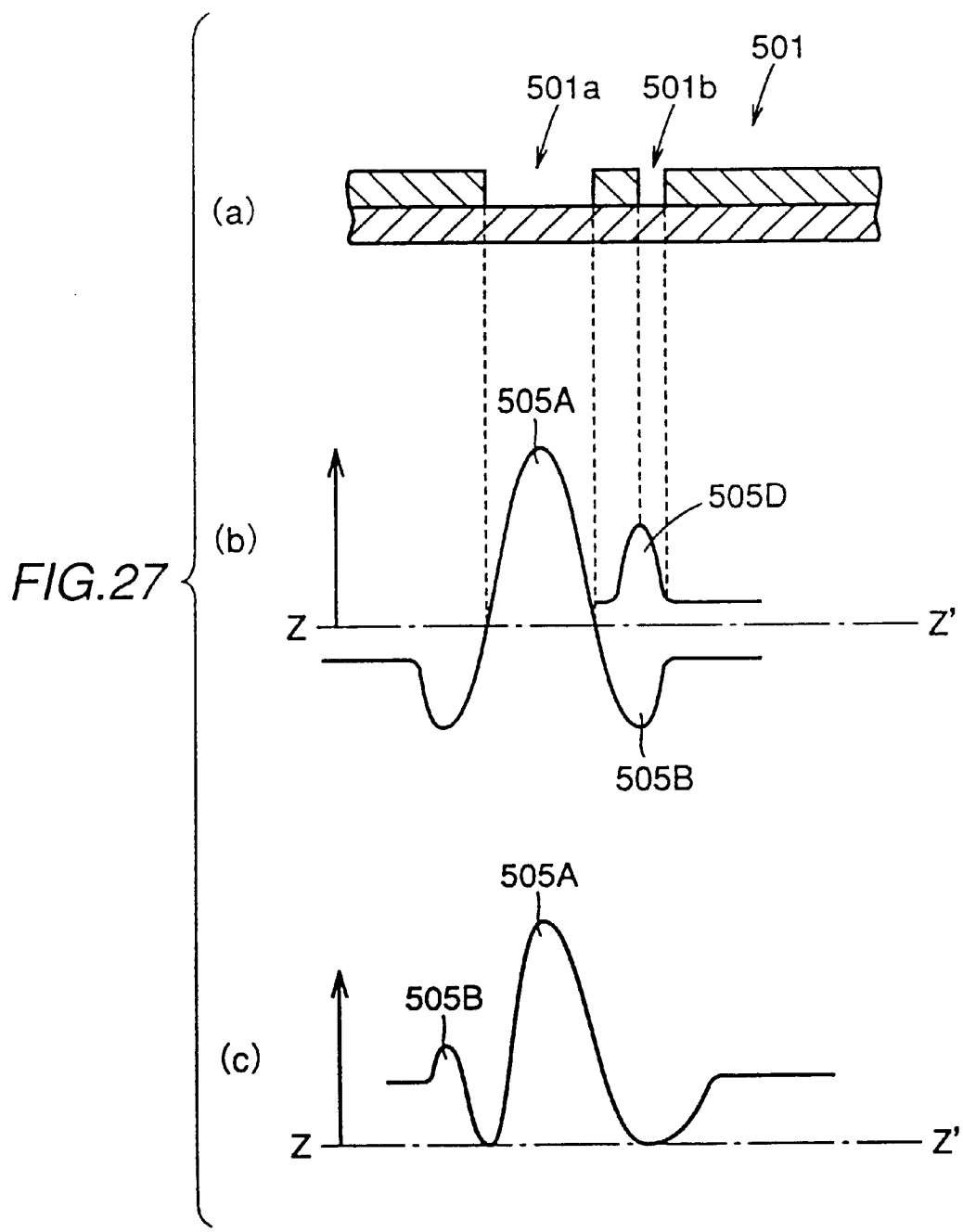
FIG. 27 shows a profile of light intensity corresponding to the cross section taken along the line Z–Z' of FIG. 26(a).

When auxiliary pattern 501b is provided in this manner, though the profile of light along the line Z–Z' of FIG. 26(a) has a side lobe 505B caused by the exposure light which has passed through light transmitting portion 501a, light intensity 505D can be obtained of which phase is reversed to the side lobe 505A because of the exposure light which has passed through auxiliary pattern 501b, as shown in (a) and (b) of FIG. 27.

As a result, the finally obtained light intensity is as shown in FIG. 27(c), which means that generation of the side lobe can be suppressed in the region where auxiliary pattern 501b is provided.

Therefore, when phase shift mask 501 such as shown in FIG. 26*a* is used, in the plan view of the pattern after wafer transfer, there is not a portion of reduced thickness in resist film 4 as shown in FIG. 26(*b*), and accurate detection signal can be obtained as shown in FIG. 26(*c*).

Figure 28:
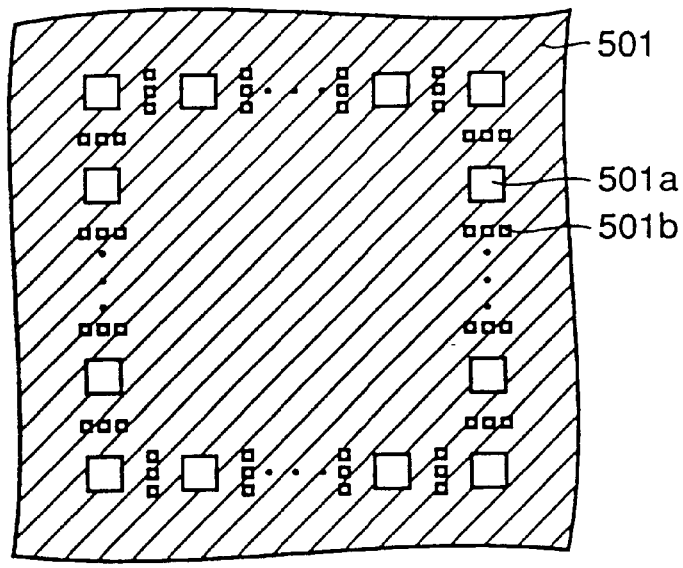
FIGS. 28 and 29 are plan views of first and second patterns showing other shapes of the phase shift mask in accordance with the third example of the fourth embodiment.
Figure 29:
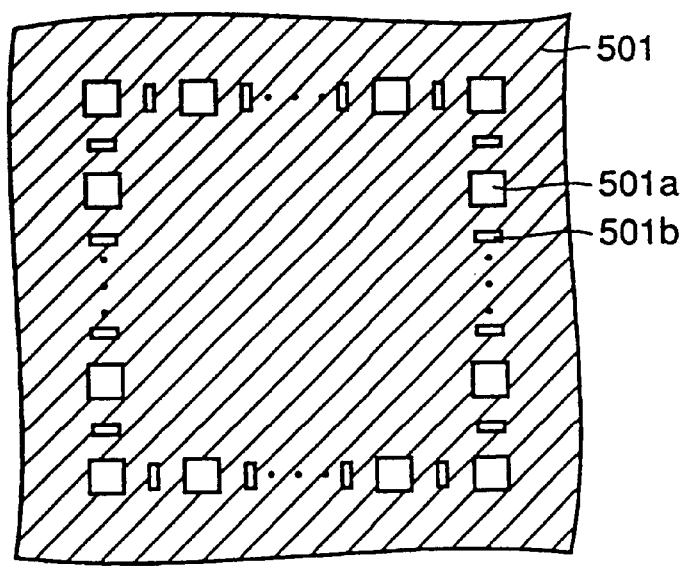
Figure 31:
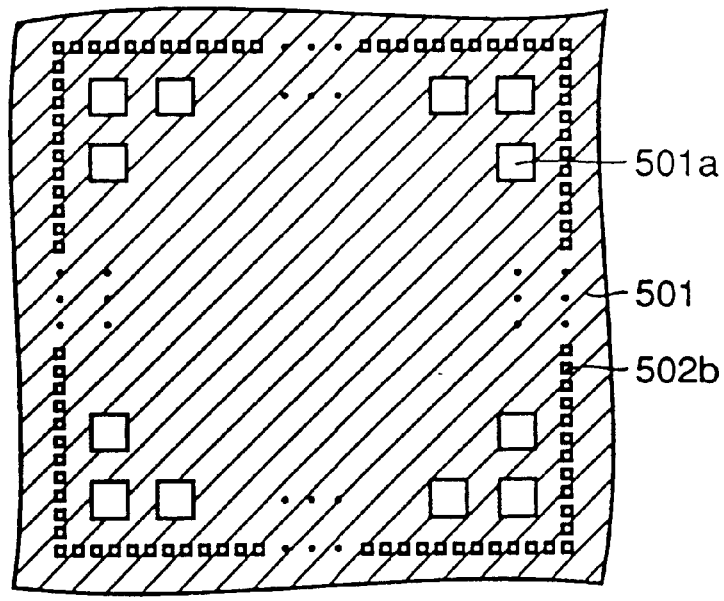
FIGS. 31 to 34 are plan views of first to fourth patterns showing other shapes of the phase shift mask in accordance with the fourth example of the fourth embodiment.
Figure 32:
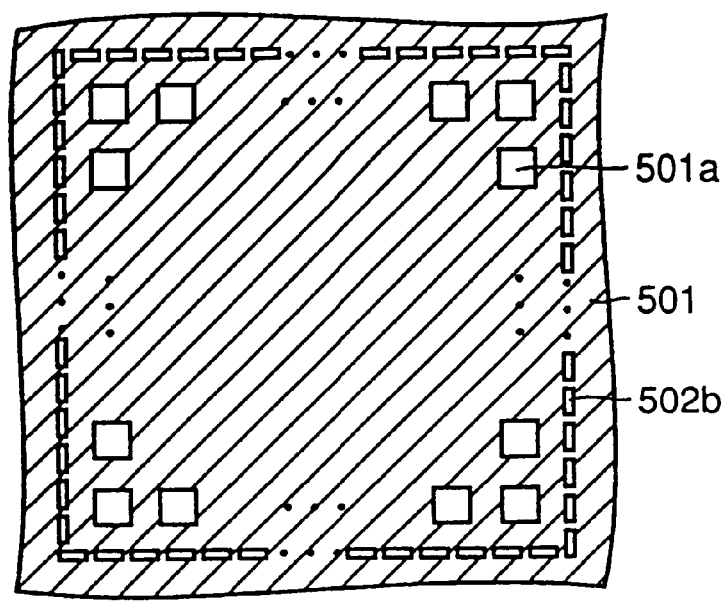
Figure 33:
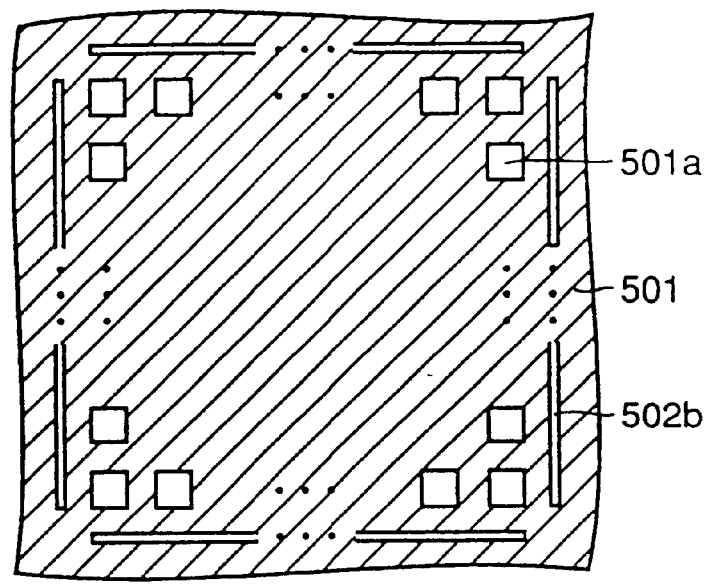
Figure 34:
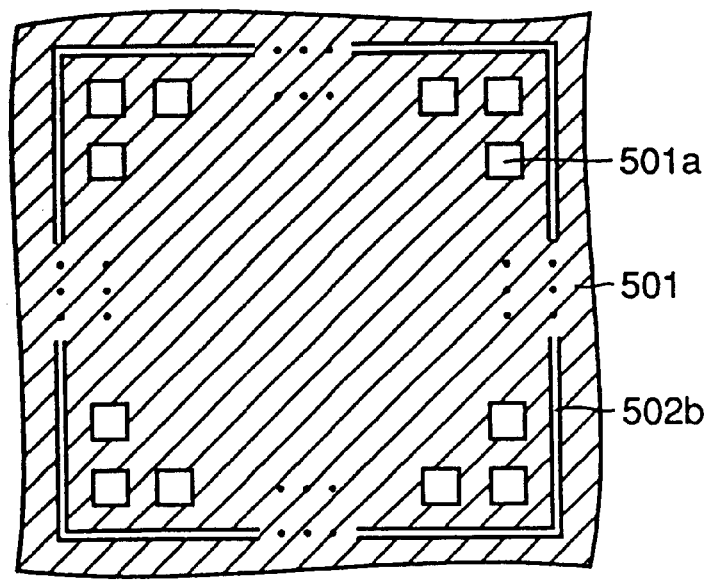

Based on the idea described with reference to the third example above, the shape of the auxiliary pattern 501*b* may be as shown in FIGS. 28 or 29, to provide the same effects.

The fourth example will be described with reference to FIG. 30. In the phase shift mask 501 of the fourth example, as shown in the plan view of the mask pattern in FIG. 30(*a*), a plurality of auxiliary patterns 502*b* of which size is not larger than the resolution limit of the exposure light source are provided to suppress generation of side lobes only outside the light transmitting portion 501*a*.

When the phase shift mask 501 having such pattern structure is used, the plan view of the pattern after wafer transfer is as shown in FIG. 30(*b*). Though there is portions 506 reduced in thickness generated in the resist film 4 inside pattern 200A, there is not a portion 506 of reduced thickness generated outside the pattern 200A.

Therefore, an accurate detection signal can be obtained as shown in FIG. 30(*c*).

In the phase shift mask 501 of the present example, if the size of the light transmitting portion 501*a* is about 0.5 $\mu$m, the distance (X) between light transmitting portion 501*a* and auxiliary pattern 502*b* should preferably be in the range of about 0.2 to 0.5 $\mu$m, and the size (S) of auxiliary pattern 502*b* should preferably be about 0.25 $\mu$m at most, though it depends on the transmissitivity of the phase shift mask.

Based on the idea described with reference to the fourth example, the shape of auxiliary pattern 502*b* may be as shown in FIGS. 31 to 34 to provide the same effects.

The fifth example will be described with reference to FIG. 35. In the phase shift mask 501 of the fifth example, referring to the plan view of the mask pattern of FIG. 35(*a*), a plurality of auxiliary patterns 502*b* and 503*b* of which sizes are not larger than the resolution limit of the exposure light source are provided to suppress generation of side lobes, both on the outer and inner sides of the light transmitting portion 501*a*.

If phase shift mask 501 having such a pattern is used, though portions 506 of reduced thickness are generated in resist film 4 on the same side as pattern 200A, there is not a portion of reduced thickness generated outside the pattern 200A.

Figure 35:
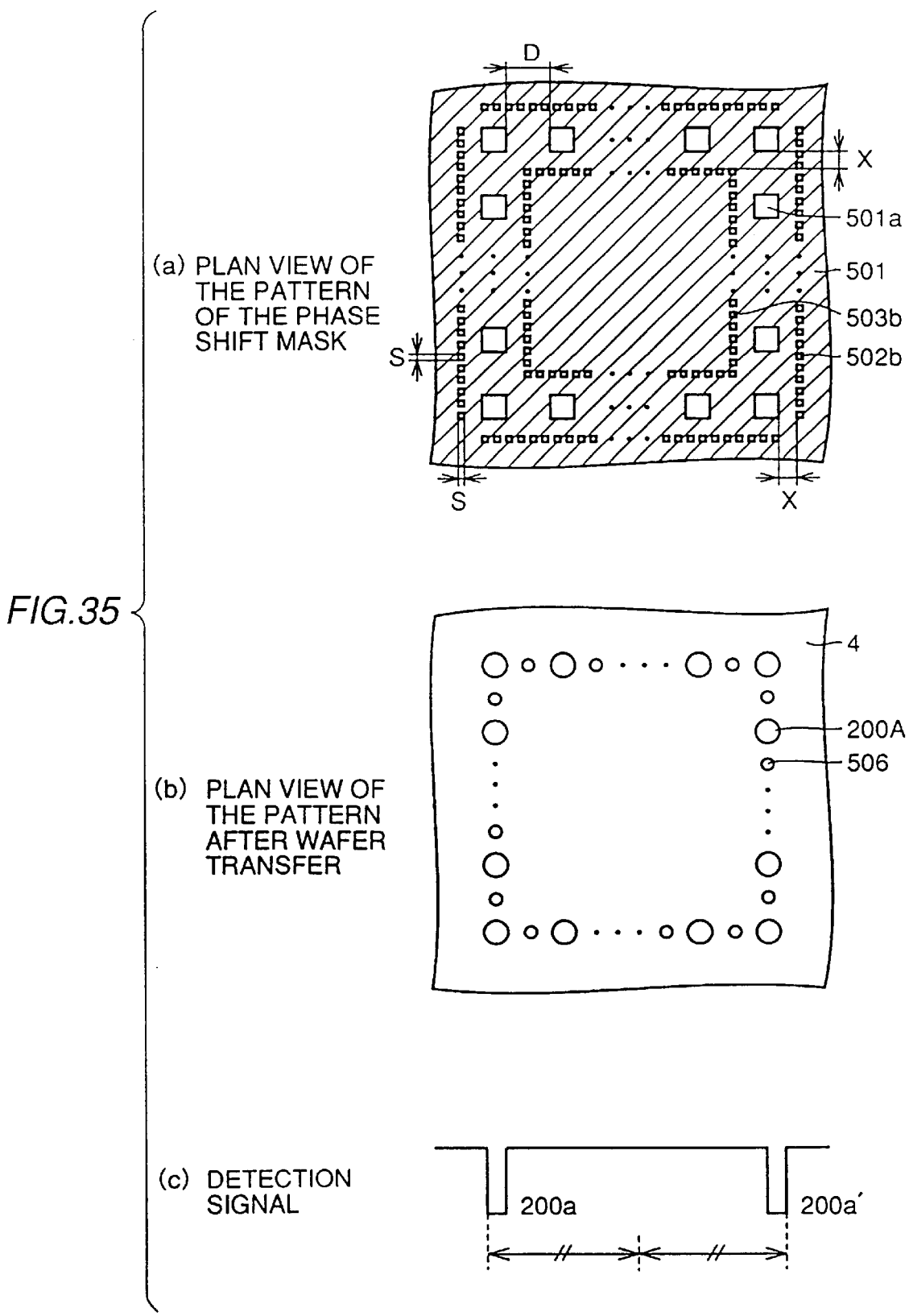
FIG. 35 shows a fifth example of the fourth embodiment in which (a) is a plan view of a mask pattern of the phase shift mask, (b) is a plan view of the pattern after wafer transfer, and (c) shows a detection signal.
Figure 36:
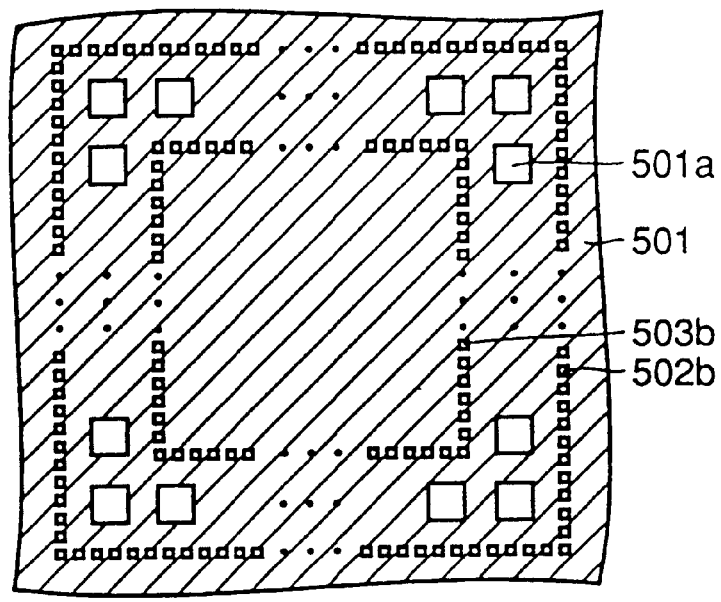
FIGS. 36 to 39 are plan views of the first to fourth patterns showing other shapes of the phase shift mask in accordance with the fifth example of the fourth embodiment.
Figure 37:
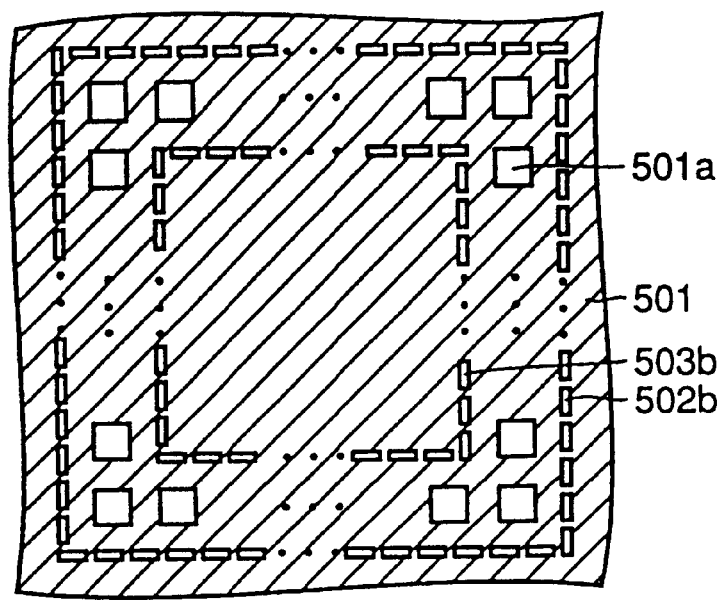
Figure 38:
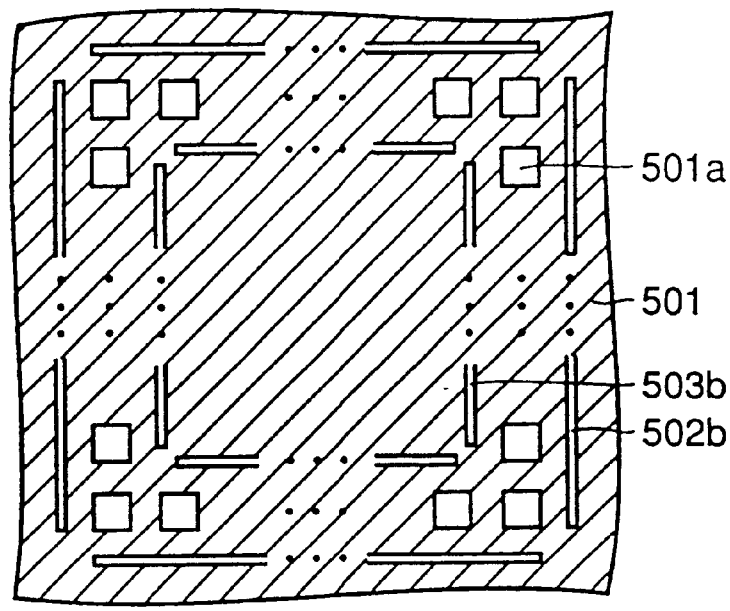
Figure 39:
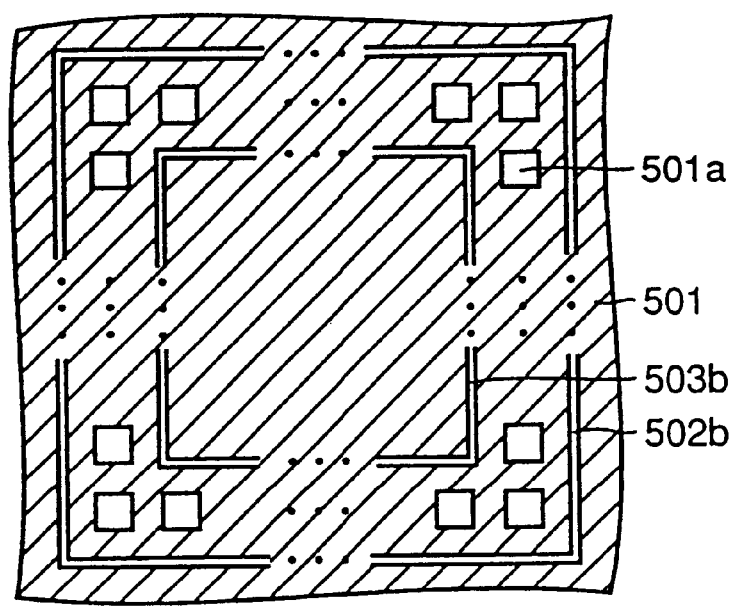

Therefore, as shown in FIG. 35(*c*), an accurate detection signal can be obtained.

In the phase shift mask 501 of the present example, if the size of the light transmitting portion 501*a* is about 0.5 $\mu$m and the wavelength of the exposure light source is i-line (365 $\mu$m), the distance (X) between light transmitting portion 501*a* and auxiliary pattern 502*b* and the distance (X) between light transmitting portion 501*a* and auxiliary pattern 503*b* should preferably be about 0.2 to 0.5 $\mu$m, and the size (S) of auxiliary patterns 502*b* and 503*b* should preferably be about 0.25 $\mu$m or less.

Based on the idea described with reference to the fifth example above, the shape of auxiliary patterns 502*b* and 503*b* may be as shown in FIGS. 36 to 39, to provide the same effects.

The sixth example will be described with reference to FIG. 40. In the phase shift mask 501 of the sixth example, a plurality of auxiliary patterns 501*b*, 502*b* and 503*b* not larger than the resolution limit of the exposure light source are provided to suppress generation of side lobes, outside, inside and between the light transmitting portions 501*a* as shown in the plan view of the mask pattern of FIG. 40(*a*).

Figure 40:
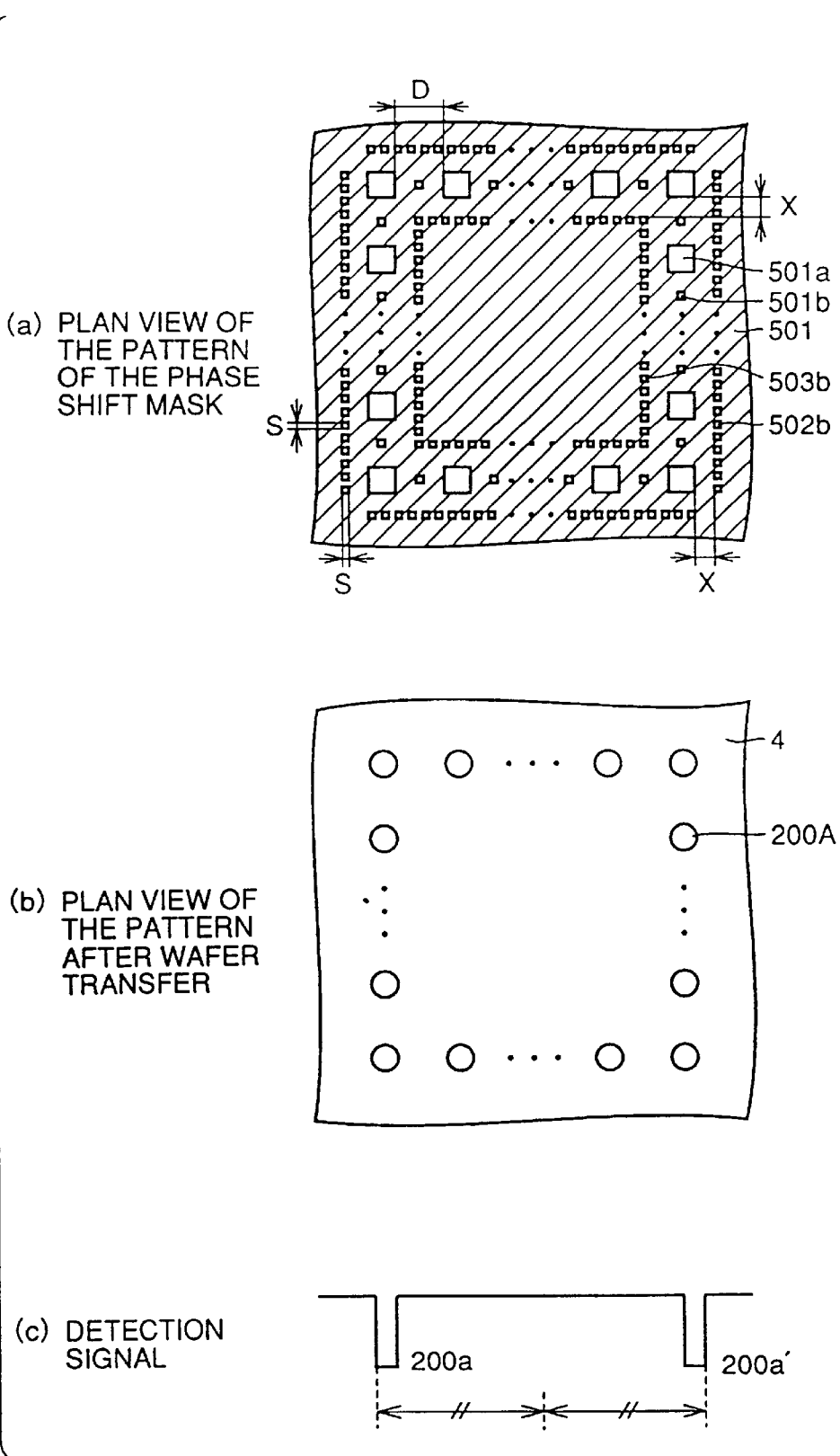
FIG. 40 shows a sixth example of the fourth embodiment in which (a) is a plan view of a mask pattern of the phase shift mask, (b) is a plan view of the pattern after wafer transfer, and (c) shows a detection signal.

The plan view of the pattern after wafer transfer when the phase shift mask 501 having such a pattern is used is as shown in FIG. 40(*b*), and as can be seen from this figure, there is not a portion of reduced thickness generated in the resist film 4. Therefore, an accurate detection signal can be obtained as shown in FIG. 40(*c*).

In the phase shift mask 501 in accordance with the present example, when the size of the light transmitting portion 501*a* is 0.5 $\mu$m and the light source of the exposure light is i-line (365 $\mu$m), the distance (D) between the light transmitting portions 501*a* should preferably be about 0.6 to 0.8 $\mu$m, the distance (X) between light transmitting portion 501*a* and each of the auxiliary patterns 502*b* and 503*b* should preferably be about 0.2 to 0.3 $\mu$m, and the sizes of auxiliary patterns 501*b*, 502*b*, 503*b* should preferably be about 0.25 $\mu$m or less.

Figure 41:
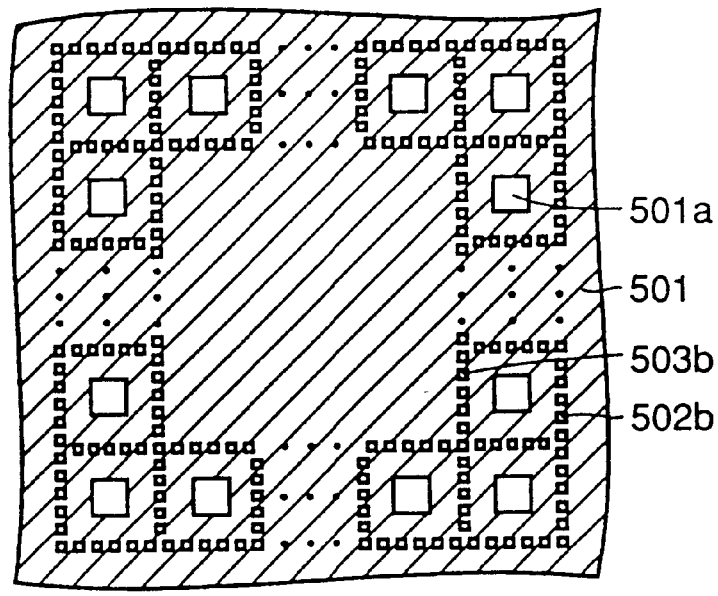
FIGS. 41 to 43 are plan views showing the first to third patterns showing other shapes of the phase shift mask in accordance with the sixth example of the fourth embodiment.
Figure 42:
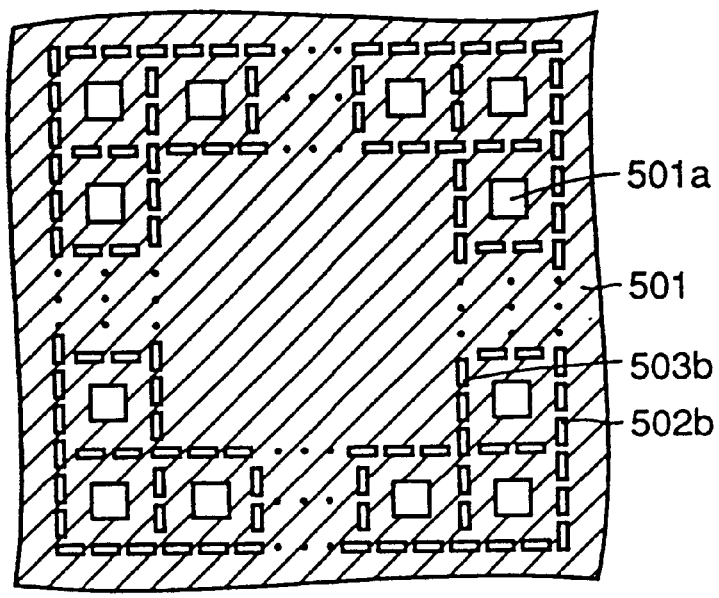
Figure 43:
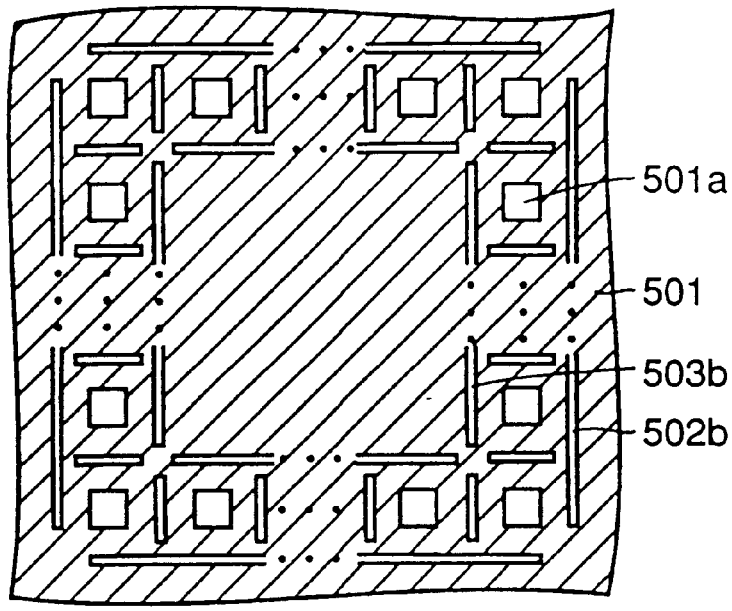

Based on the idea described with reference to the sixth example, the shapes of auxiliary patterns 501*b*, 502*b*, and 503*b* may be as shown in FIGS. 41 to 43, to provide the same effects.

The seventh example will be described with reference to FIG. 44.

The phase shift mask 501 of the seventh example corresponds to the phase shift mask 501 in accordance with the fourth example shown in FIG. 30, and in the seventh example, the light transmitting portion 501*a* has light transmitting portion 501*b* consisting of continuous openings.

Figure 44:
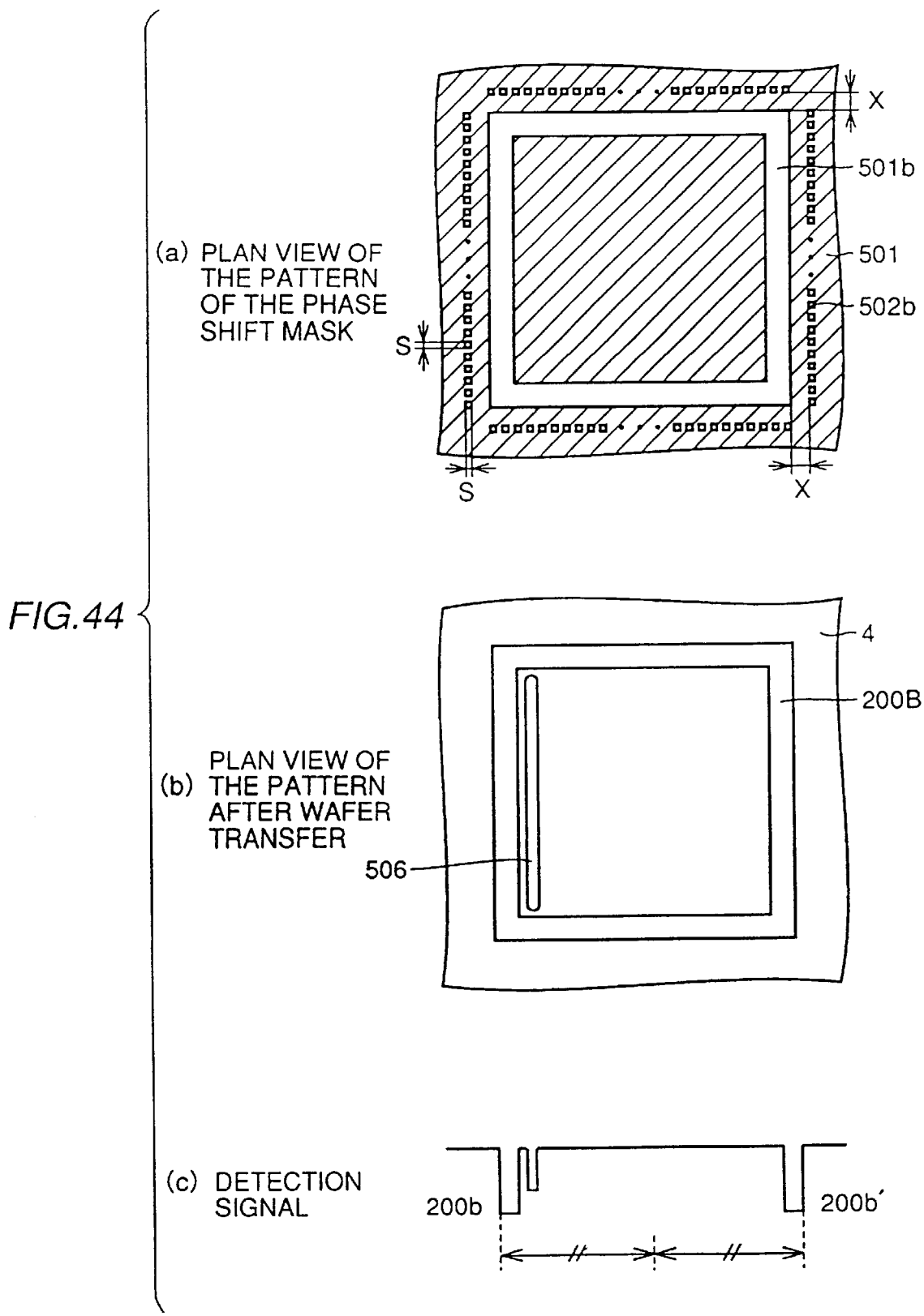
FIG. 44 shows a seventh example of the fourth embodiment in which (a) is a plan view of the mask pattern of the phase shift mask, (b) is a plan view of the pattern after wafer transfer, and (c) shows a detection signal.
Figure 45:
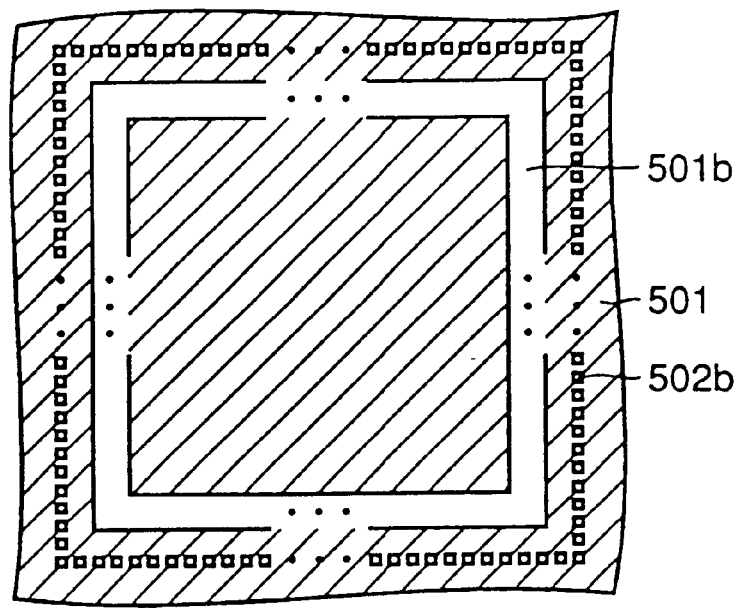
FIGS. 45 to 48 are plan views showing the first to fourth patterns showing other shapes of the phase shift mask in accordance with the seventh example of the fourth embodiment.
Figure 46:
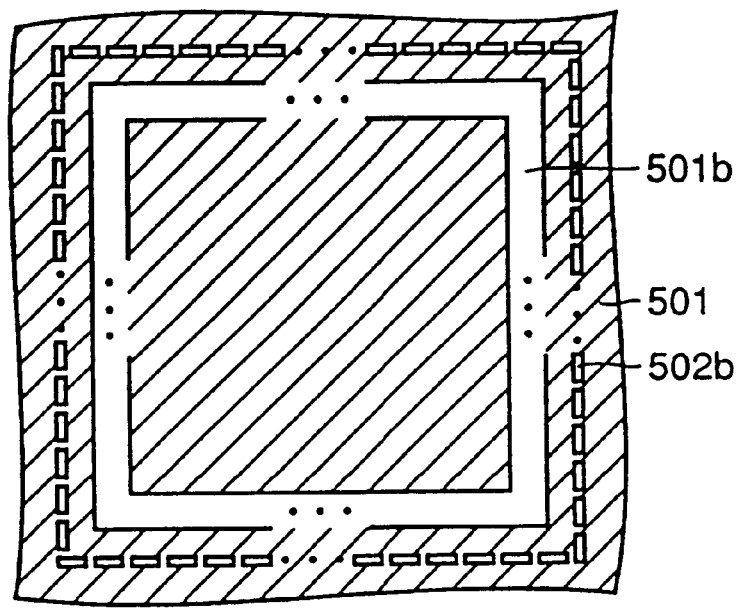
Figure 47:
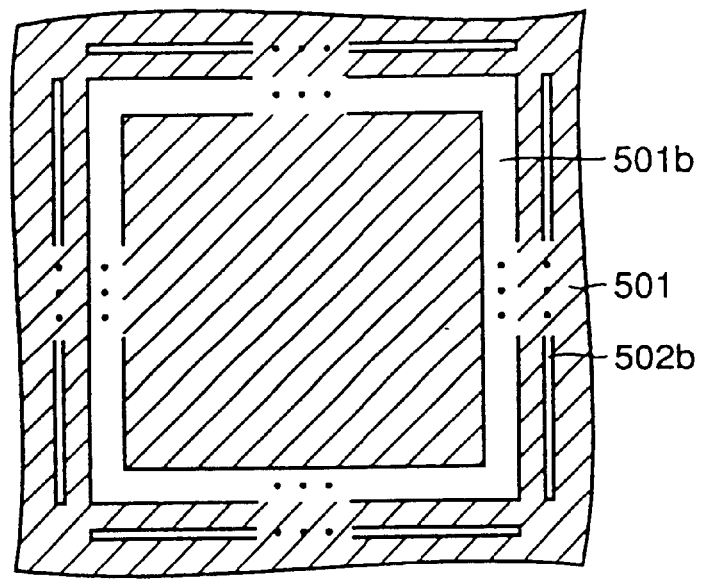
Figure 48:
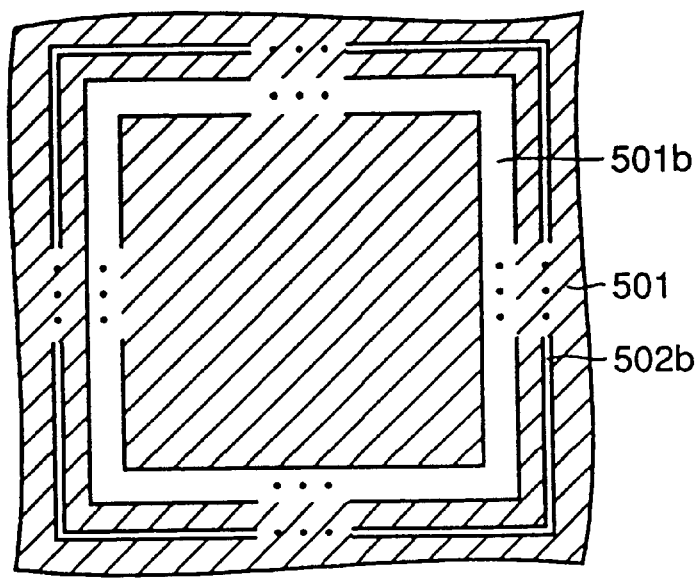
Figure 50:
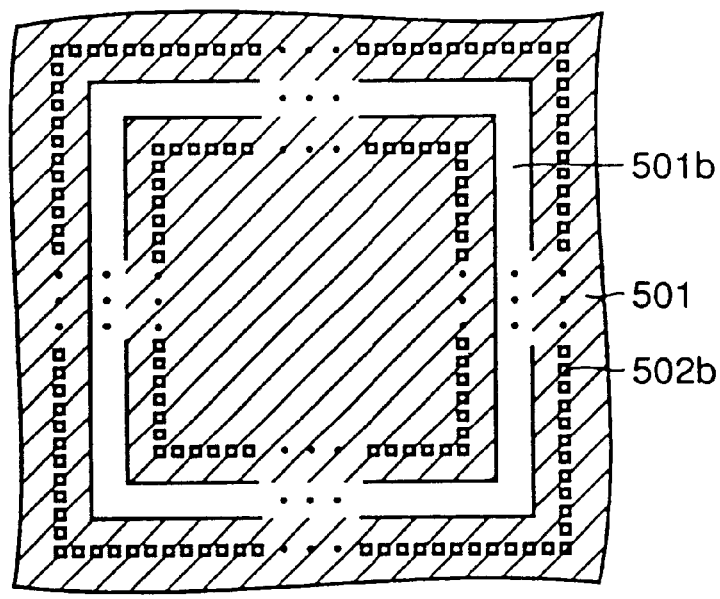
FIGS. 50 to 53 are plan views showing the first to fourth patterns showing other shapes of the phase shift mask in accordance with the eighth example of the fourth embodiment.
Figure 51:
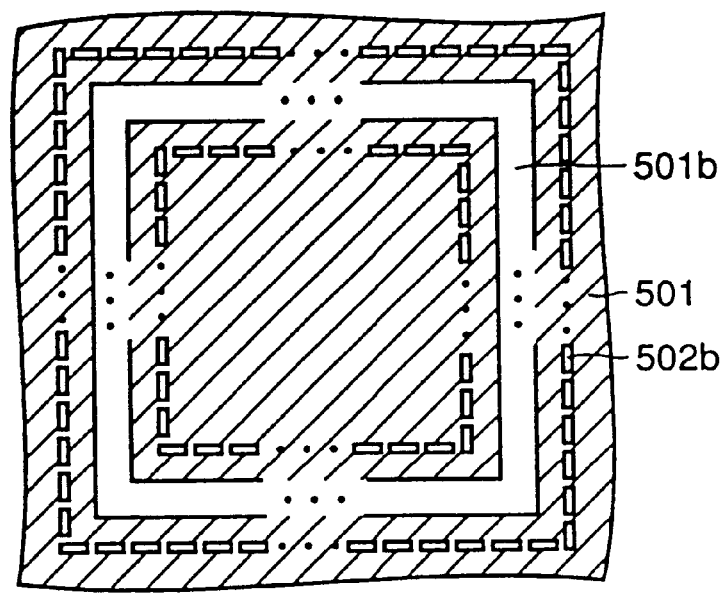
Figure 52:
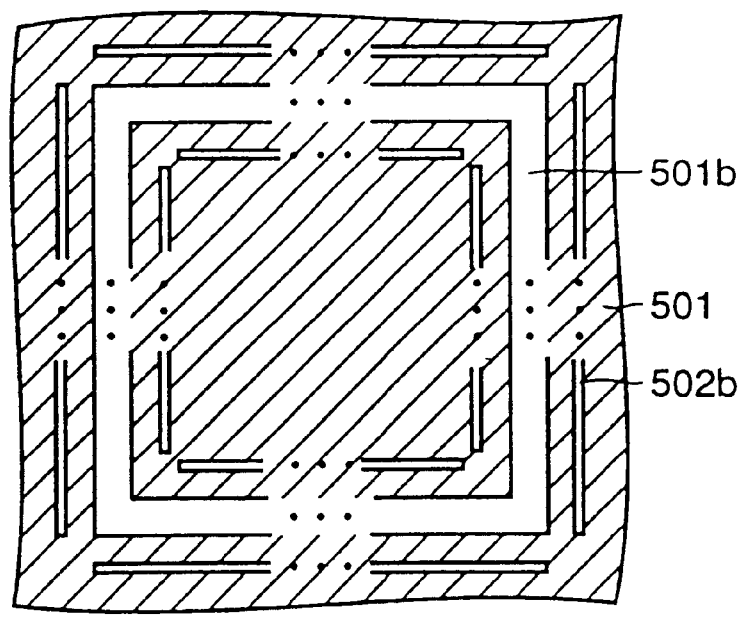
Figure 53:
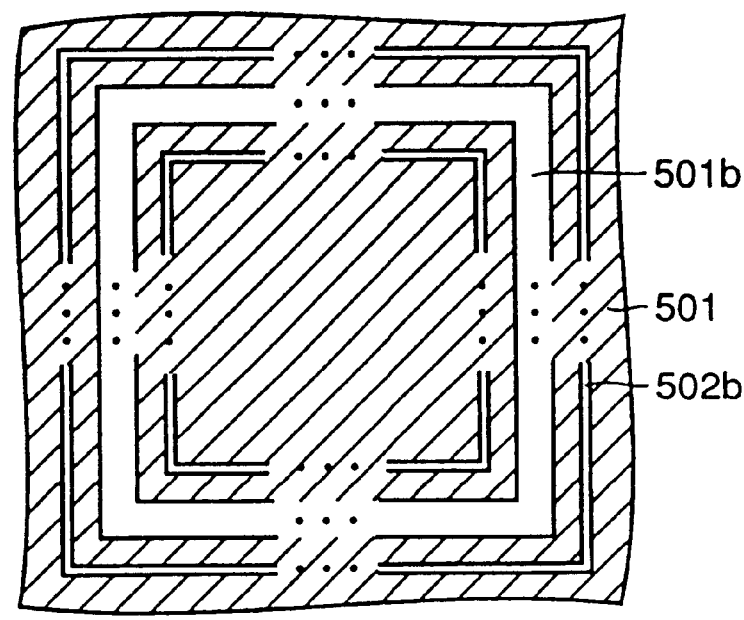
Figure 54:
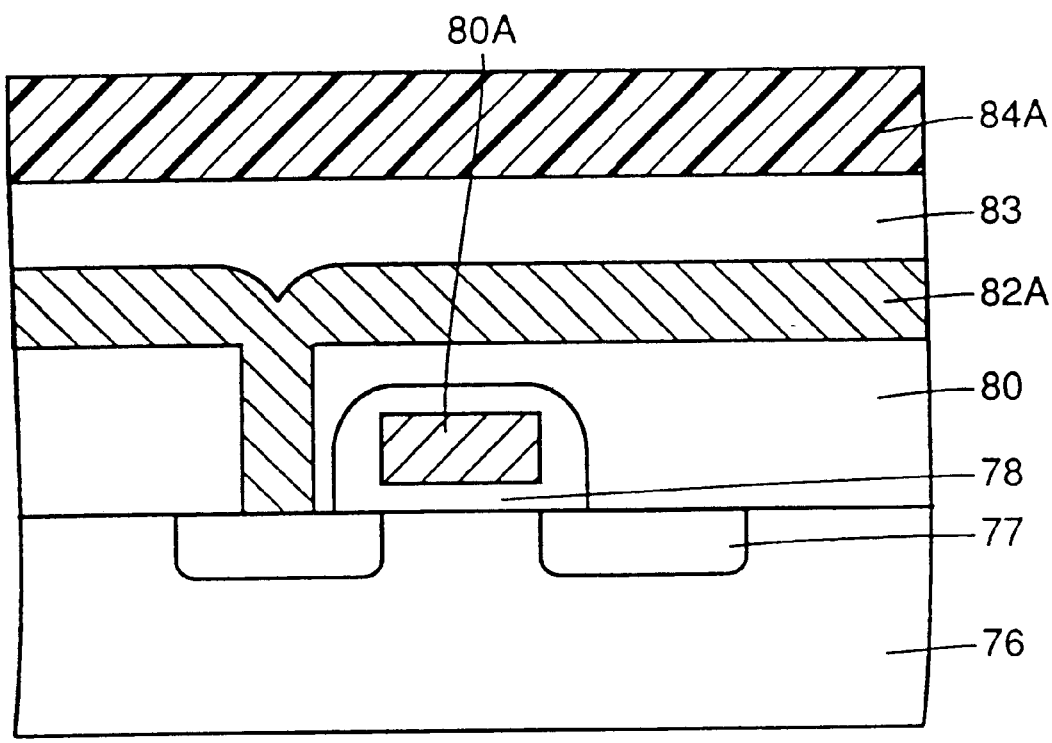
FIG. 54 is a cross section showing a structure of a conventional MOS transistor.

In the phase shift mask 501 of the seventh example also, as can be seen from the plan view of the mask pattern of FIG. 44(*a*), a plurality of auxiliary patterns 502*b* not larger than the resolution limit of the exposure light source are provided to suppress the generation of side lobe such that it is generated only outside the light transmitting portion 501*a*.

When the phase shift mask 501 having such a pattern is used, the plan view of the pattern after wafer transfer is as shown in FIG. 44(*b*). Namely, though there is a portion 506 of reduced thickness generated in the resist film 4 inside the pattern 200B, there is not a portion 506 of reduced thickness generated outside the pattern 200*b*.

Therefore, as shown in FIG. 44(*c*), an accurate detection signal can be obtained.

As for the size of light transmitting portion 501*b*, the distance (X) between light transmitting portion 501*b* and auxiliary pattern 502*b* and the size (S) of auxiliary pattern 502*b*, these have similar values as described in the fourth example above.

Based on the idea described with reference to the seventh example above, the shape of the auxiliary pattern 502*b* may be as shown in FIGS. 45 to 48, for example, to obtain similar effects.

The eighth example will be described with reference to FIG. 49.

The phase shift mask 501 of the eighth example corresponds to the phase shift mask 501 of the fifth example shown in FIG. 35, and in the eighth example, the light transmitting portion 501 has light transmitting portion 501*b* including continuous openings.

As shown in the plan view of the mask pattern in FIG. 49(*a*), a plurality of auxiliary patterns 502*b* and 503*b* not larger than the resolution limit of the exposure light source are provided to suppress generation of side lobes inside and outside the light transmitting portion 501*b*.

When the phase shift mask 501 having such a pattern is used, the plan view of the pattern after wafer transfer is as shown in FIG. 49(*b*), and as shown in the figure, there is not a portion of reduced thickness.

Therefore, as shown in FIG. 49(*c*), an accurate detection signal can be obtained.

As for the distance (X) between light transmitting portion 501*b* and each of auxiliary patterns 502*b* and 503*b*, and the size (S) of auxiliary patterns 502*b* and 503*b* in the present example, these are similar to those in the phase shift mask of the fifth example.

Based on the idea described with reference to the eighth example above, the shape of the auxiliary patterns 502*b* and 503*b* may be as shown in FIGS. 50 to 53, for example, to provide similar effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor device including
  a semiconductor device forming region in which a plurality of patterns constituting semiconductor elements of prescribed shapes are formed on a semiconductor substrate,
  a registration accuracy measurement mark forming region for measuring registration accuracy between each of said layers constituting said semiconductor device,
  a first semiconductor element forming member formed in a first layer in said semiconductor device forming region,
  a first measurement mark formed in same manufacturing step as said first semiconductor element forming member in said registration accuracy measurement mark forming region, having a pattern receiving same influence of aberration as said first semiconductor element forming member when irradiated with light,
  a second semiconductor element forming member formed in a second layer above said first layer in said semiconductor device forming region, and
  a second measurement mark formed in same manufacturing step as said second semiconductor element forming member for measuring registration accuracy between said first semiconductor element forming member and said second semiconductor element forming member in said registration accuracy measurement mark forming region, and having a pattern receiving same influence of aberration as said second semiconductor element forming member when irradiated with light, wherein
  said first mark has a pattern includes a plurality of first auxiliary measurement marks combined along at least four sides of a virtual rectangle, the first auxiliary measurement mark having approximately same size as pattern size of said first semiconductor element forming member, and
  said second measurement mark includes a plurality of second auxiliary measurement marks combined along at least four sides of a virtual rectangle, said second auxiliary measurement mark having approximately same size as pattern size of said second semiconductor element forming member,
  a method of repairing, part of said first auxiliary measurement mark of said first measurement mark and part of said second auxiliary measurement mark of said second measurement mark having a defect comprising the step of:
    repairing said defective first and second auxiliary measurement marks, and simultaneously, performing same processing on said first auxiliary measurement mark and said second auxiliary measurement mark which are in point symmetry to said defective first and second auxiliary measurement marks with respect to an intersection of diagonals of said virtual rectangle.

2. The method of repairing defect of a registration accuracy measurement mark according to claim 1, wherein
  said first and second auxiliary measurement marks include negative patterns, and
  said defect is repaired by filling said defect with a prescribed repairing member.

3. The method of repairing defect of a registration accuracy measurement mark according to claim 1, wherein
  said first and second auxiliary measurement marks are positive patterns, and
  said defect is repaired by removing said defect.

* * * * *

UNITED STATES PATENT AND TRADEMARK OFFICE
CERTIFICATE OF CORRECTION

PATENT NO. : 6,323,560 B1
DATED : November 27, 2001
INVENTOR(S) : Koichiro Narimatsu et al.

It is certified that error appears in the above-identified patent and that said Letters Patent is hereby corrected as shown below:

Column 8,
Line 33, replace "Y-Y' XXII -XXII" with -- XXIII - XXIII --

Column 9,
Line 44, replace "LVII(b) - LVII(b)" with -- LVIII(b) - LVIII(b) --
Line 46, replace "LVII(b)-LVII(b)" with -- LVIII(b) - LVIII(b) --

Signed and Sealed this

Twenty-seventh Day of August, 2002

Attest:

JAMES E. ROGAN
Attesting Officer    Director of the United States Patent and Trademark Office